(12) United States Patent
Yamauchi

(10) Patent No.: US 9,243,894 B2
(45) Date of Patent: Jan. 26, 2016

(54) PRESSURE APPLICATION APPARATUS AND PRESSURE APPLICATION METHOD

(75) Inventor: Akira Yamauchi, Uji (JP)

(73) Assignee: BONDTECH CO., LTD., Kyoto (JP)

( * ) Notice: Subject to any disclaimer, the term of this patent is extended or adjusted under 35 U.S.C. 154(b) by 970 days.

(21) Appl. No.: 13/386,788

(22) PCT Filed: Mar. 9, 2010

(86) PCT No.: PCT/JP2010/053845
§ 371 (c)(1), (2), (4) Date: Jan. 24, 2012

(87) PCT Pub. No.: WO2011/033797
PCT Pub. Date: Mar. 24, 2011

(65) Prior Publication Data
US 2012/0127485 A1      May 24, 2012

(30) Foreign Application Priority Data

Sep. 18, 2009   (JP) ................................ 2009-216985

(51) Int. Cl.
*G01B 11/14* (2006.01)
*H01L 23/00* (2006.01)
(Continued)

(52) U.S. Cl.
CPC ................ *G01B 11/14* (2013.01); *H01L 24/75* (2013.01); *H01L 24/81* (2013.01); *H05K 3/303* (2013.01); *H01L 23/544* (2013.01); *H01L 24/83* (2013.01); *H01L 2224/131* (2013.01); *H01L 2224/13124* (2013.01); *H01L 2224/13144* (2013.01); *H01L 2224/13147* (2013.01); *H01L 2224/16225* (2013.01); *H01L 2224/75* (2013.01); *H01L 2224/757* (2013.01); *H01L 2224/75301* (2013.01); *H01L 2224/81009* (2013.01); *H01L 2224/8113* (2013.01);
(Continued)

(58) Field of Classification Search
CPC .......... H01L 33/58; G01J 3/02; G01J 3/0291
USPC .......................... 356/614, 620, 622, 389, 388
See application file for complete search history.

(56) References Cited

U.S. PATENT DOCUMENTS 6,089,442 A    7/2000   Ouchi et al.
6,219,908 B1 *  4/2001   Farnworth ........... G01R 1/0433
                                              324/750.05
(Continued)

FOREIGN PATENT DOCUMENTS

EP    0 264 648    4/1988
EP    1 067 598    1/2001
(Continued)

*Primary Examiner* — Kara E Geisel
*Assistant Examiner* — Iyabo S Alli
(74) *Attorney, Agent, or Firm* — Jordan and Hamburg LLP

(57) ABSTRACT

A pressure application technique is provided that enables two objects to be pressurized (e.g., objects to be bonded) to be positioned with greater accuracy before having pressure applied thereto. The objects to be pressurized are moved relative to each other in a Z direction such that the objects are brought into contact with each other (step S13). Then, a horizontal positional shift ΔD between the objects to be pressurized is measured in the contact state of the objects to be pressurized (step S14). Thereafter, positioning of the objects to be pressurized is again performed by moving the objects to be pressurized relative to each other in the horizontal direction, as a result of which the positional shift ΔD is corrected (step S17).

27 Claims, 34 Drawing Sheets

(51) Int. Cl.
*H05K 3/30* (2006.01)
*H01L 23/544* (2006.01)
*H05K 1/02* (2006.01)

(52) U.S. Cl.
CPC ........... *H01L 2224/81121* (2013.01); *H01L 2224/81132* (2013.01); *H01L 2224/81191* (2013.01); *H01L 2224/81204* (2013.01); *H01L 2224/81801* (2013.01); *H01L 2224/83121* (2013.01); *H01L 2924/0001* (2013.01); *H01L 2924/01004* (2013.01); *H01L 2924/014* (2013.01); *H01L 2924/01005* (2013.01); *H01L 2924/01006* (2013.01); *H01L 2924/0107* (2013.01); *H01L 2924/01013* (2013.01); *H01L 2924/01029* (2013.01); *H01L 2924/01033* (2013.01); *H01L 2924/01075* (2013.01); *H01L 2924/01079* (2013.01); *H01L 2924/1461* (2013.01); *H01L 2924/15788* (2013.01); *H01L 2924/181* (2013.01); *H05K 1/0269* (2013.01); *H05K 2201/09918* (2013.01); *H05K 2203/166* (2013.01)

(56) References Cited

U.S. PATENT DOCUMENTS

| | | | |
|---|---|---|---|
| 6,892,447 | B1 | 5/2005 | Yamauchi et al. |
| 8,253,941 | B2 * | 8/2012 | Chang ............... B29C 59/026 356/401 |
| 2004/0224441 | A1 | 11/2004 | Saito |
| 2005/0071990 | A1 | 4/2005 | Nakamura et al. |
| 2006/0218781 | A1 | 10/2006 | Nakamura et al. |
| 2008/0241601 | A1 * | 10/2008 | Moriwaki et al. ............ 428/836 |
| 2010/0168908 | A1 | 7/2010 | Maeda et al. |

FOREIGN PATENT DOCUMENTS

| | | |
|---|---|---|
| JP | 1-098235 | 4/1989 |
| JP | 11-121517 | 4/1999 |
| JP | 2002-040459 | 2/2002 |
| JP | 2004-127981 | 4/2004 |
| JP | 2004-128224 | 4/2004 |
| JP | 2004-296692 | 10/2004 |
| JP | 2005-294824 | 10/2005 |
| JP | 2006-032791 | 2/2006 |
| JP | 2007-157970 | 6/2007 |
| JP | 2008-085322 | 4/2008 |
| JP | 2009-184338 | 8/2009 |
| JP | 2009-220151 | 10/2009 |
| JP | 2010-272707 | 12/2010 |
| WO | WO-02/41384 | 5/2002 |
| WO | WO-2006/017037 | 2/2006 |
| WO | WO-2008/156152 | 12/2008 |

* cited by examiner

PRESSURE APPLICATION APPARATUS AND PRESSURE APPLICATION METHOD

TECHNICAL FIELD

The present invention relates to a technique for applying pressure to two objects to be pressurized.

BACKGROUND OF THE INVENTION

There is technology for bonding two objects to be bonded together. For example, Patent Document 1 describes a mounting apparatus (bonding apparatus) that bonds a component held by a head and a substrate held on a stage together so that the component is mounted on the substrate. Note that such a technique is also referred to as a technique for bonding two objects to be pressurized (objects to be bonded) together by applying pressure.

In such an apparatus, firstly, the positions (specifically, horizontal positions) of two objects to be bonded that are not in contact with each other are detected. Then, positioning (alignment) is performed based on the detection result of the horizontal positions of the objects to be bonded, so as to eliminate a shift in the relative positions of the objects to be bonded in the horizontal direction. Thereafter, the objects to be bonded are brought closer to and then into contact with each other, so that the objects to be bonded are bonded together.

However, the above-described technique has problems such as that a positional shift can occur due to various factors when two objects to be bonded that are not in contact with each other are brought into contact with each other. For example, the horizontal positions of the objects to be bonded may be shifted slightly by the action of physical impact force generated when the objects to be bonded are brought into contact with each other.

Development of fine processing technology in recent years is creating situations where such a positional shift cannot be tolerated.

PRIOR ART DOCUMENTS

Patent Document

[Patent Document 1] JP 2008-85322A

SUMMARY OF THE INVENTION

The purpose of the present invention is to provide a pressure application technique that enables two objects to be pressurized (e.g., objects to be bonded) to be positioned with greater accuracy before having pressure applied thereto.

In order to solve the above-described problems, a first aspect of the present invention relates to a pressure application apparatus that applies pressure to objects to be pressurized including a first object to be pressurized and a second object to be pressurized. The pressure application apparatus includes relative movement means for moving the first object to be pressurized and the second object to be pressurized relative to each other in a predetermined direction, first measurement means for measuring a positional shift between the first object to be pressurized and the second object to be pressurized in a plane perpendicular to the predetermined direction, in a state in which the objects to be pressurized are in contact with each other by the relative movement operation performed by the relative movement means, and alignment means for performing positioning of the objects to be pressurized, by correcting the positional shift.

A second aspect of the present invention relates to a pressure application method for applying pressure to objects to be pressurized including a first object to be pressurized and a second object to be pressurized. The pressure application method includes the steps of: a) moving the first object to be pressurized and the second object to be pressurized relative to each other in a predetermined direction such that the first object to be pressurized and the second object to be pressurized are brought into contact with each other, b) measuring a positional shift between the first object to be pressurized and the second object to be pressurized in a plane perpendicular to the predetermined direction, in a state in which the objects to be pressurized are in contact with each other, and c) performing positioning of the objects to be pressurized, by correcting the positional shift.

A third aspect of the present invention relates to a pressure application apparatus that applies pressure to objects to be pressurized including a first object to be pressurized and a second object to be pressurized with a fluidizable substance layer sandwiched between the objects to be pressurized. The pressure application apparatus includes relative movement means for moving the first object to be pressurized and the second object to be pressurized relative to each other in a predetermined direction, first measurement means for measuring a positional shift between the objects to be pressurized in a plane perpendicular to the predetermined direction, in a contact state in which the first object to be pressurized and the fluidizable substance layer adhering to the second object to be pressurized are in contact with each other by a relative movement operation performed by the relative movement means, and alignment means for performing positioning of the objects to be pressurized, by correcting the positional shift.

A fourth aspect of the present invention relates to a pressure application method for applying pressure to objects to be pressurized including a first object to be pressurized and a second object to be pressurized with a fluidizable substance layer sandwiched between the objects to be pressurized. The pressure application method includes the steps of: a) moving the objects to be pressurized relative to each other in a predetermined direction such that the first object to be pressurized and the fluidizable substance layer adhering to the second object to be pressurized are brought into contact with each other, b) measuring a positional shift between the objects to be pressurized in a plane perpendicular to the predetermined direction, in a state in which the first object to be pressurized and the fluidizable substance layer adhering to the second object to be pressurized are in contact with each other, and c) performing positioning of the objects to be pressurized, by correcting the positional shift.

EFFECTS OF THE INVENTION

With the present invention, it is possible to correct a positional shift due to contact and to thereby position two objects be pressurized with greater accuracy before having pressure applied thereto.

DESCRIPTION OF THE PREFERRED EMBODIMENTS

Hereafter, embodiments of the present invention will be described with reference to the drawings.

1. First Embodiment 1-1. Apparatus Structure

Figure 1:
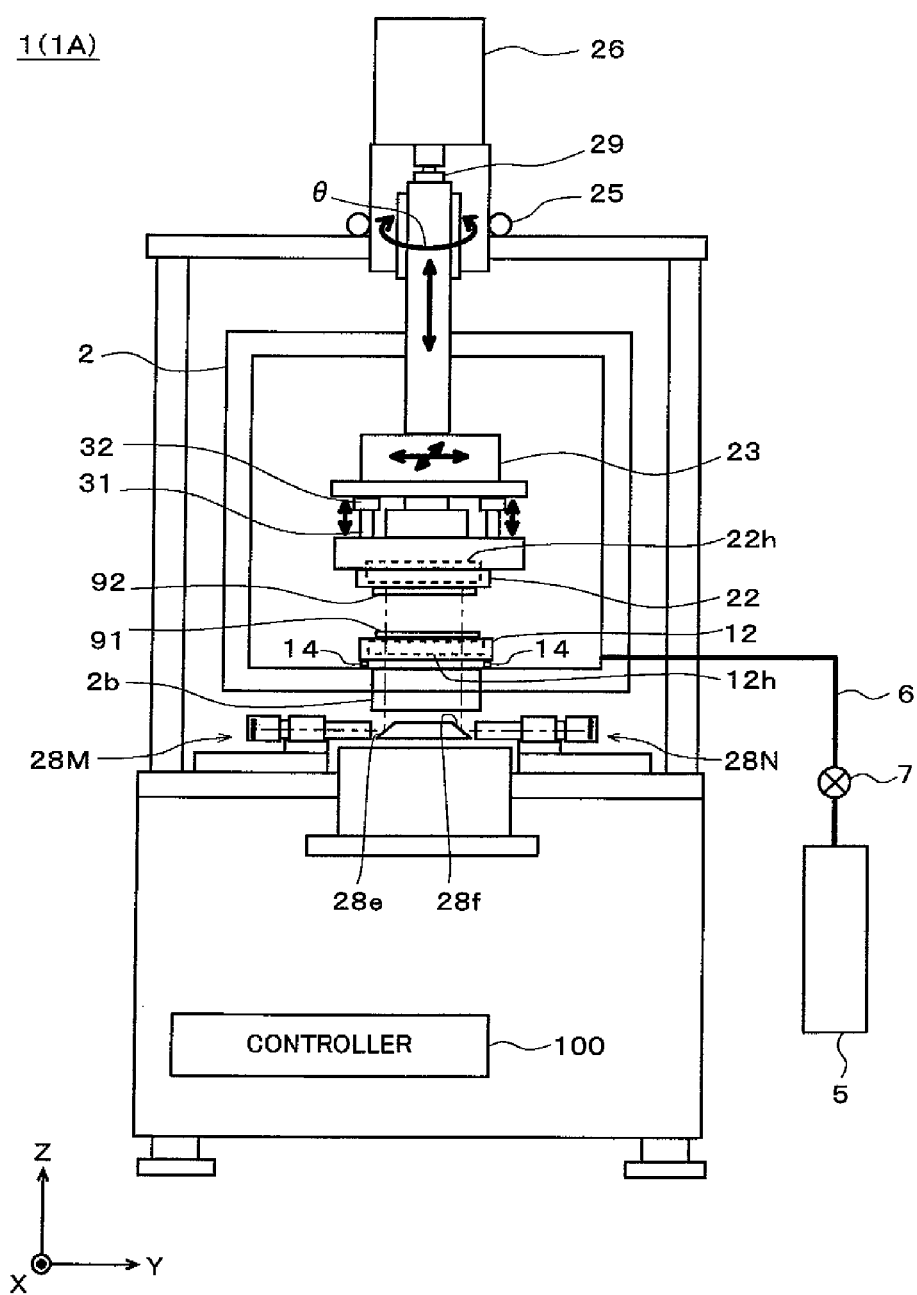
FIG. 1 is a side view showing the internal structure of a bonding apparatus.
Figure 2:
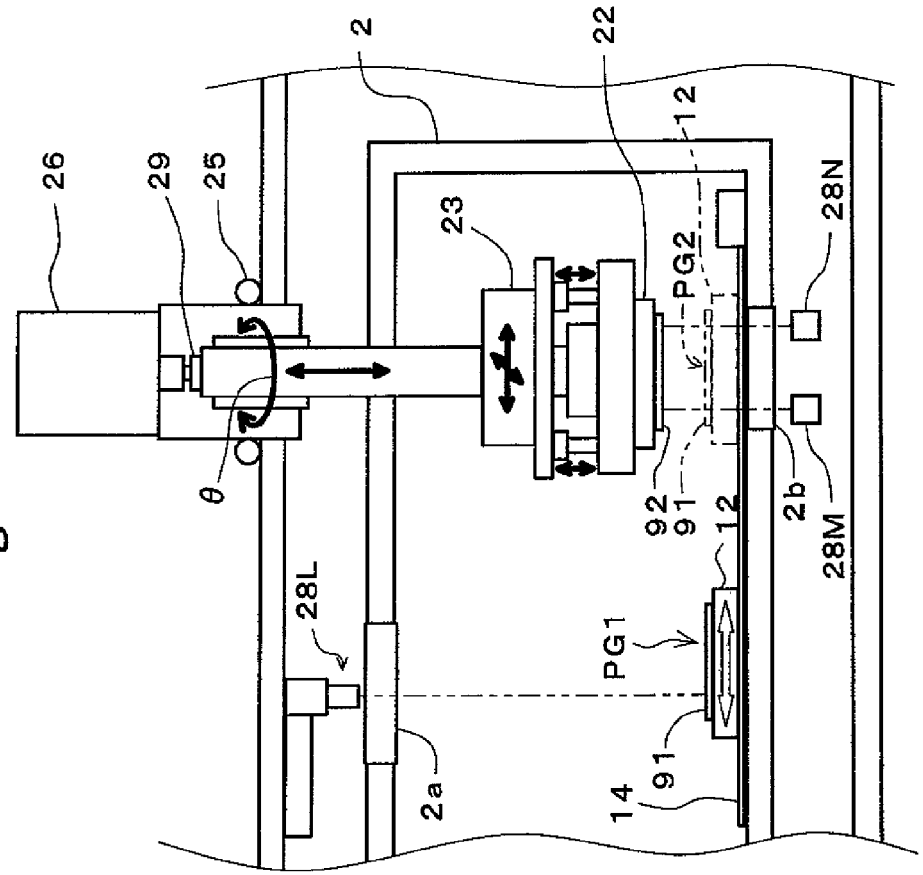
FIG. 2 is a side view showing the internal structure of the bonding apparatus.

FIGS. 1 and 2 are side views showing the internal structure of a bonding apparatus 1 (also referred to as "1A") according to a first embodiment of the present invention. Note that, for the sake of convenience, directions and the like are shown using an XYZ orthogonal coordinate system in the following figures.

Figure 9:
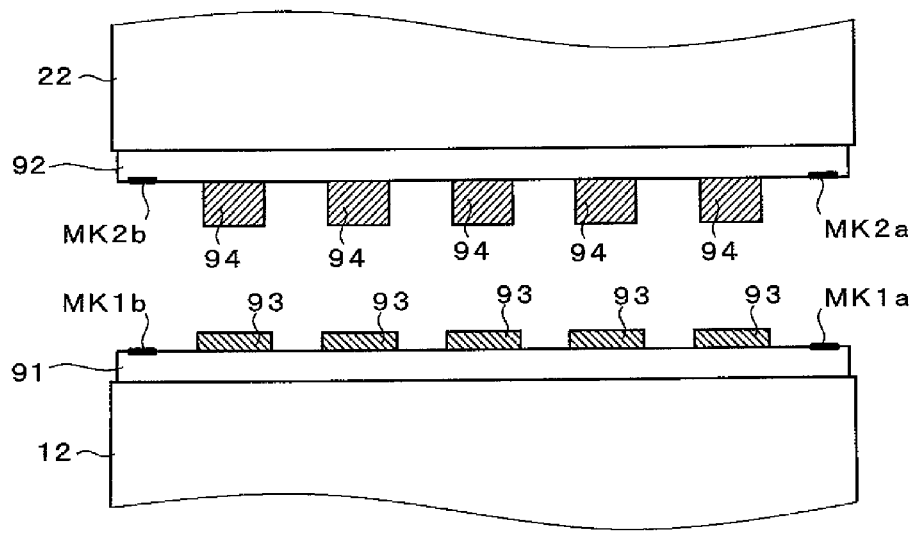
FIG. 9 is a diagram showing a situation in which two objects to be bonded are correctly disposed (in a non-contact state).
Figure 10:
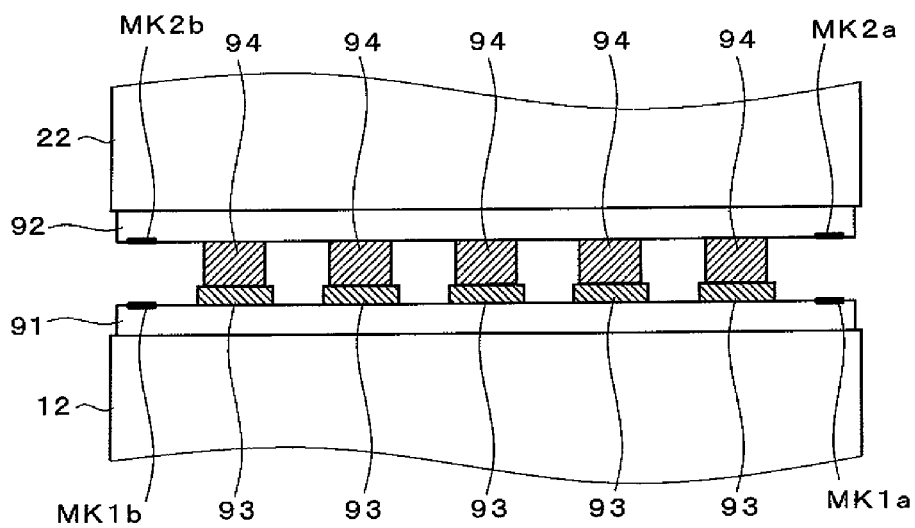
FIG. 10 is a diagram showing a situation in which two objects to be bonded are correctly disposed (in a contact state).

The bonding apparatus 1 is an apparatus for bonding an object to be bonded 91 and an object to be bonded 92 together by disposing the objects to be bonded 91 and 92 facing each other and applying pressure and heat thereto in a chamber (vacuum chamber) 2 under reduced pressure. Here a situation is assumed in which a substrate 91 and a chip (component) 92 are bonded together, more specifically, a situation in which pads (electrodes) 93 on the substrate 91 and metal bumps (electrodes) 94 on the chip 92 are bonded together, as shown in FIGS. 9 and 10. So-called solder bumps formed of an appropriate solder material can be used as the metal bumps 94. Also, the metal bumps 94 are not limited thereto, and may be formed of various types of metal materials such as gold (Au), copper (Cu), or aluminum (Al). Note that in FIG. 9 and other figures, the pads 93 and the metal bump 94 are shown in an exaggerated manner for convenience of illustration.

Surface activation processing is performed in advance on bonding surfaces of the objects to be bonded 91 and 92 (the pads 93 and the metal bumps 94). It is assumed here that an apparatus outside of the bonding apparatus 1 performs surface activation processing in advance on the objects to be bonded 91 and 92, and thereafter the objects to be bonded 91 and 92 are carried into the bonding apparatus 1.

The surface activation processing is processing for activating the bonding surfaces of the objects to be bonded 91 and 92, and is implemented by emitting a specific substance (e.g., argon) using a beam irradiation unit. The beam irradiation unit activates the bonding surfaces of the objects to be bonded 91 and 92 by accelerating an ionized specific substance (e.g., argon) in an electric field and emitting that specific substance toward the bonding surfaces of the objects to be bonded 91 and 92. In other words, the beam irradiation unit activates the bonding surfaces of the objects to be bonded 91 and 92 by irradiating the bonding surfaces of the objects to be bonded 91 and 92 with energy waves. Examples of the beam irradiation unit include an atomic beam irradiation apparatus and an ion beam irradiation apparatus.

The bonding apparatus 1 is also referred to as a mounting apparatus for bonding the component 92 held by a head 22 and the substrate 91 held on a stage 12 together so that the component 92 is mounted on the substrate 91. The bonding apparatus 1 is further referred to as a pressure application apparatus for applying pressure to the objects to be pressurized, namely the component 92 and the substrate 91, because the bonding between the objects to be pressurized is implemented by applying pressure in this bonding apparatus 1.

The bonding apparatus 1 includes the vacuum chamber 2 serving as space for processing the objects to be bonded 91 and 92. The vacuum chamber 2 is connected to a vacuum pump 5 via an exhaust pipe 6 and an exhaust valve 7. The vacuum chamber 2 is evacuated to a vacuum as a result of a suction operation of the vacuum pump 5 reducing pressure in the vacuum chamber 2. The exhaust valve 7 enables adjustment of the degree of vacuum in the vacuum chamber 2 through the operation of opening and closing the valve and the operation of adjusting the exhaust flow.

The objects to be bonded 91 and 92 are placed between a pressure surface 22$f$ (see FIG. 3) of the head 22 (which is also referred to as a "pressure application member") and a pressure surface 12$f$ of the stage 12 (which is also referred to as a "pressure application member"). Specifically, the object to be bonded 92 on the upper side is held by the head 22 (more specifically, by an electrostatic chuck, a mechanical chuck, or the like provided at the tip of the head). Similarly, the object to be bonded 91 on the lower side is held on the stage 12 (more specifically, by an electrostatic chuck, a mechanical chuck, or the like provided at the tip of the stage).

The head 22 is heated by a heater 22$h$ build in the head 22, and thereby can adjust the temperature of the object to be bonded 92 held by the head 22. Similarly, the stage 12 is heated by a heater 12$h$ built in the stage 12, and thereby can adjust the temperature of the object to be bonded 91 on the stage 12. The head 22 is also capable of rapidly cooling the head 22 itself to around a room temperature TH1, using an air-cooled cooling apparatus or the like built in the head 22. The same applies for the stage 12. The heaters 12$h$ and 22$h$ (in particular, 22$h$) function as a heating unit (melting units) or the like that melts the metal bumps 94, and also function as a cooling unit (solidification unit) or the like that cools and again solidifies the metal bumps 94. That is, the heaters 12$h$ and 22$h$ (in particular, 22$h$) function as a heating/cooling unit that heats or cools the metal bumps 94.

These head 22 and stage 12 are both movably installed in the vacuum chamber 2.

The stage 12 is capable of moving (translating) in an X direction by a slide movement mechanism 14 (see FIG. 2). The stage 12 moves in the X direction between a standby position (in the vicinity of a position PG1) on the relatively left side in FIG. 2 and a bonding position (in the vicinity of a position PG2 that is immediately below the head 22) on the relatively right side. The slide movement mechanism 14 includes a high-precision position detector (linear scale), so the stage 12 is positioned with high accuracy.

The head 22 is moved (translated) in X and Y directions (two translational directions parallel to a horizontal plane) by an alignment table 23, and is rotated in a θ direction (direction of rotation about an axis parallel to a Z axis) by a rotation drive mechanism 25. The head 22 is driven by the alignment table 23 and the rotation drive mechanism 25 based on, for example, results of position detection by a position recognition unit 28 described later, and an alignment operation is performed in the X, Y, and θ directions. Moving the stage 12 and the head 22 relative to each other in the respective directions (X, Y, and θ directions) (in short, a horizontal direction) that are along a plane perpendicular to the vertical direction (Z direction) in this way enables the object to be bonded 91 held on the stage 12 and the object to be bonded 92 held by the head 22 to be aligned in the horizontal direction.

The head 22 is also moved (elevated or lowered) in the Z direction by a Z-axis up-down drive mechanism 26. Moving the stage 12 and the head 22 relative to each other in the Z direction enables the object to be bonded 91 held on the stage 12 and the object to be bonded 92 held by the head 22 to be brought into contact with each other and then bonded together under pressure. Note that the Z-axis up-down drive mechanism 26 is also capable of controlling pressure applied at the time of bonding, based on signals detected by multiple pressure detection sensors (e.g., load cells) 29 and 32 (32$a$, 32$b$, and 32$c$).

Figure 3:
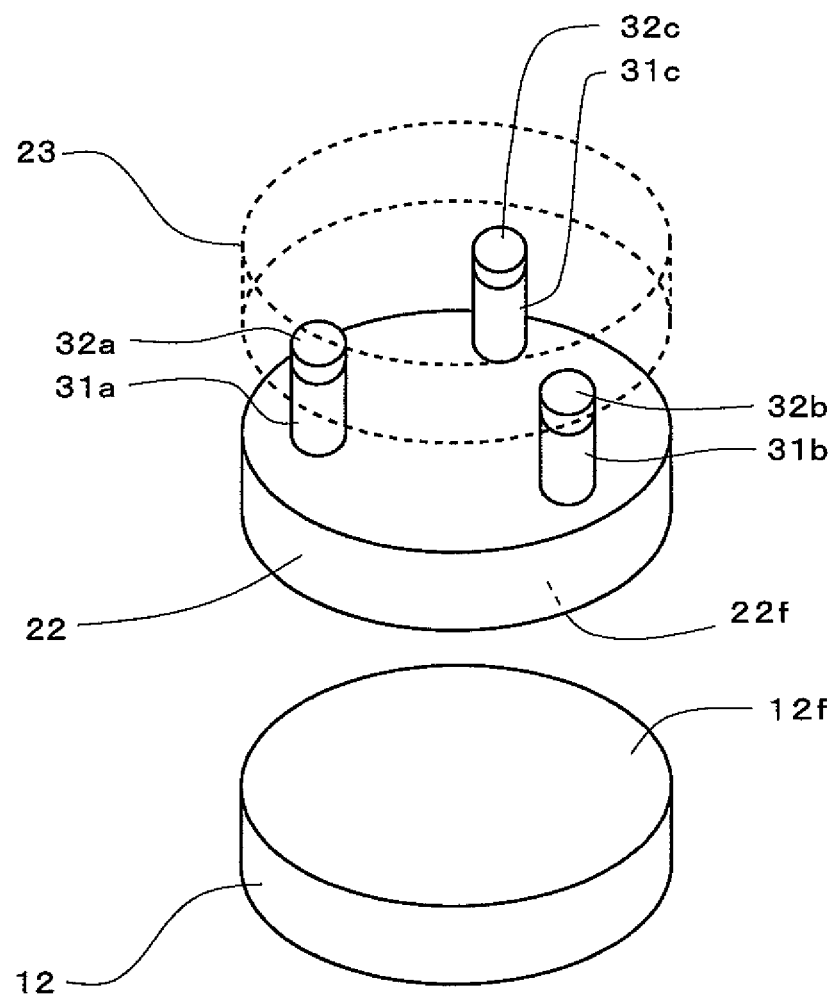
FIG. 3 is a schematic perspective view showing the vicinity of a stage and a head.

FIG. 3 is a schematic perspective view showing the vicinity of the stage 12 and the head 22. Note that, in FIG. 3, the stage 12, the head 22, and the like are shown in a general shape (generally cylindrical shape) in order to simplify the illustration.

As also shown in FIG. 3, the bonding apparatus 1 further includes three piezoelectric actuators 31 (31$a$, 31$b$, and 31$c$) and three pressure detection sensors 32 (32$a$, 32$b$, and 32$c$).

The three piezoelectric actuators 31$a$, 31$b$, and 31$c$ and the three pressure detection sensors 32$a$, 32$b$, and 32$c$ are provided between the head 22 and the alignment table 23. To be more specific, the three piezoelectric actuators 31$a$, 31$b$, and 31$c$ are fixed to the upper surface of the head 22 at different positions (three positions that are not on the identical straight line). More specifically, the three piezoelectric actuators 31$a$, 31$b$, and 31$c$ are disposed at generally equal intervals in the vicinity of the outer peripheral portion of the generally circular upper surface of the generally cylindrical head 22. The three pressure detection sensors 32$a$, 32$b$, and 32$c$ connect the upper end surfaces of their corresponding piezoelectric actuators 31$a$, 31$b$, and 31$c$ and the lower surface of the alignment table 23. In other words, the three pressure detection sensors 32$a$, 32$b$, and 32$c$ are disposed at three independent positions (positions that are not on the identical straight line) in a plane parallel to the pressure surface of the head 22.

The three piezoelectric actuators 31$a$, 31$b$, and 31$c$ are extendable in the Z direction independently from each other, and are capable of finely adjusting the posture (specifically, the angles of posture around two axes (e.g., around X and Y axes)) and position (specifically, Z-direction position) of the head 22. The three pressure detection sensors 32$a$, 32$b$, and 32$c$ are capable of measuring pressures applied to the three positions (positions that are not on the identical straight line) in a plane parallel to the lower surface (pressure surface) 22$f$ of the head 22. By driving the three piezoelectric actuators 31$a$, 31$b$, and 31$c$ so as to equalize the pressures applied to the respective positions, it is possible to bond the objects to be bonded 91 and 92 together while maintaining the lower surface 22$f$ of the head 22 (see FIG. 2) and the upper surface (pressure surface) 12$f$ of the stage 12 in parallel with each other.

1-2. Position Recognition Unit

The bonding apparatus 1 also includes the position recognition unit 28 that recognizes the horizontal positions (specifically, X-, Y-, and θ-positions) of the objects to be bonded 91 and 92.

As shown in FIGS. 1 and 2, the position recognition unit 28 includes image capturing units (cameras) 28L, 28M, and 28N that acquire an optical image of an object to be bonded or the like as image data. The image capturing units 28L, 28M, and 28N each include a coaxial illumination system. Note that light (e.g., infrared light) transmitted through the objects to be bonded 91 and 92, the stage 12, and the like is used as light sources of the coaxial illumination systems of the image capturing units 28M and 28N.

Figure 4:
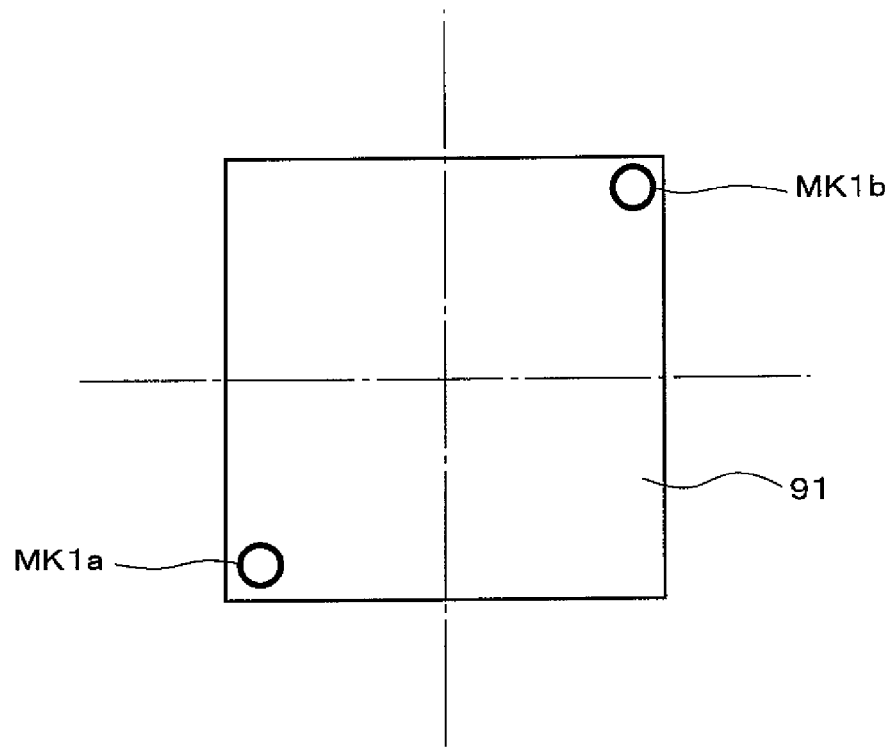
FIG. 4 is a diagram showing two alignment marks added to one of objects to be bonded.
Figure 5:
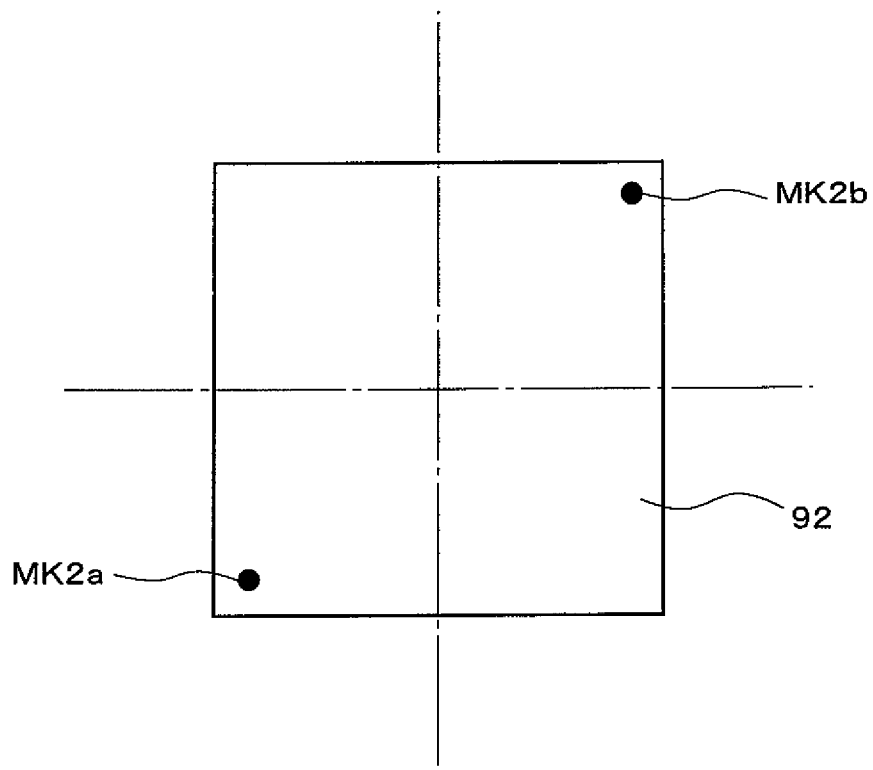
FIG. 5 is a diagram showing two alignment marks added to the other of the objects to be bonded.

Here, as shown in FIGS. 4 and 5, marks for positioning (hereinafter, also referred to as "alignment marks", for example) MK are added to the objects to be bonded 91 and 92. For example, two alignment marks MK1a and MK1b (see FIG. 4) are added to the one object to be bonded 91, and two alignment marks MK2a and MK2b (see FIG. 5) are added to the other object to be bonded 92.

The operation of positioning the objects to be bonded 91 and 92 (alignment operation) is executed by the position recognition unit (e.g., cameras) 28 recognizing the positions of the alignment marks MK added to the objects to be bonded 91 and 92.

For example, as shown in FIG. 2, the image capturing unit 28L of the position recognition unit 28 acquires an optical image of the object to be bonded 91 present at the position PG1 as image data. Specifically, light emitted from the light source disposed above the outside of the vacuum chamber 2 is transmitted through a window 2a of the vacuum chamber 2 and reaches the object to be bonded 91 (position PG1), where then the light is reflected. The light reflected by the object to be bonded 91 is transmitted again through the window 2a of the vacuum chamber 2 and proceeds to reach the image capturing unit 28L. In this way, the image capturing unit 28L acquires the optical image of the object to be bonded 91 as image data. Then, the image capturing unit 28L extracts the alignment marks MK1 (such as MK1a) based on the image data, recognizes the positions of the alignment marks MK1, and by extension, recognizes the position of the object to be bonded 91.

Similarly, the image capturing unit 28M of the position recognition unit 28 acquires an optical image of the object to be bonded 92 present at the position PG2 as image data. Specifically, light emitted from the light source disposed below the outside of the vacuum chamber 2 is transmitted through a window 2b of the vacuum chamber 2 and reaches the object to be bonded 92 (position PG2), where then the light is reflected. The light reflected by the object to be bonded 92 (specifically, part of the object) is transmitted again through the window 2b of the vacuum chamber 2 and proceeds to reach the image capturing unit 28M. In this way, the image capturing unit 28M acquires the optical image of the object to be bonded 92 as image data. Also, the image capturing unit 28M extracts the alignment marks MK2 (such as MK2a) based on the image data, recognizes the positions of the alignment marks MK2, and by extension, recognizes the position of the object to be bonded 92.

As described above, a captured image GL is acquired by the image capturing unit 28L in a state in which the object to be bonded 91 is present in the vicinity of the position PG1, and a captured image GM is acquired by the image capturing unit 28M in a state in which the object to be bonded 92 is present in the vicinity of the position PG2. Thereafter, the object to be bonded 91 is moved in the X direction toward the vicinity of the position PG2, following the stage 12 being moved in the X direction by the slide movement mechanism 14.

In this case, the bonding apparatus 1 obtains the amounts of shift of the objects to be bonded 91 and 92 from their reference positions respectively based on the images GL and GM. Then, the bonding apparatus 1 adjusts the amount of X-direction movement of the object to be bonded 91, and adjusts the Y-direction position or the like of the object to be bonded 92, based on the amounts of shift. As a result, the object to be bonded 91 is moved to the position PG2, and accordingly the objects to be bonded 91 and 92 have a substantially proper relative positional relationship in the horizontal direction in a state in which the objects to be bonded 91 and 92 are spaced facing each other. Such a rough positioning operation is also referred to as "rough alignment". Alternatively, this positioning operation is also referred to as a "pre-alignment operation" because this is an alignment operation performed prior to an even more precise alignment operation (which is also referred to as a "fine alignment operation") as described later.

The position recognition unit 28 is also capable of executing a position measurement operation for fine alignment operation as described later. Specifically, in the state in which the objects to be bonded 91 and 92 face each other, the position recognition unit 28 is also capable of recognizing the positions of the objects to be bonded 91 and 92, using the captured images (image data) GA of transmitted light and reflected light of illumination light emitted from the coaxial illumination systems of the image capturing units 28M and 28N. In other words, the operation of positioning the objects to be bonded 91 and 92 (fine alignment operation) is executed by the position recognition unit (such as cameras) 28 simultaneously recognizing the positions of the two sets (MK1a and MK2a) and (MK1b and MK2b) of alignment marks added to the objects to be bonded 91 and 92.

Figure 6:
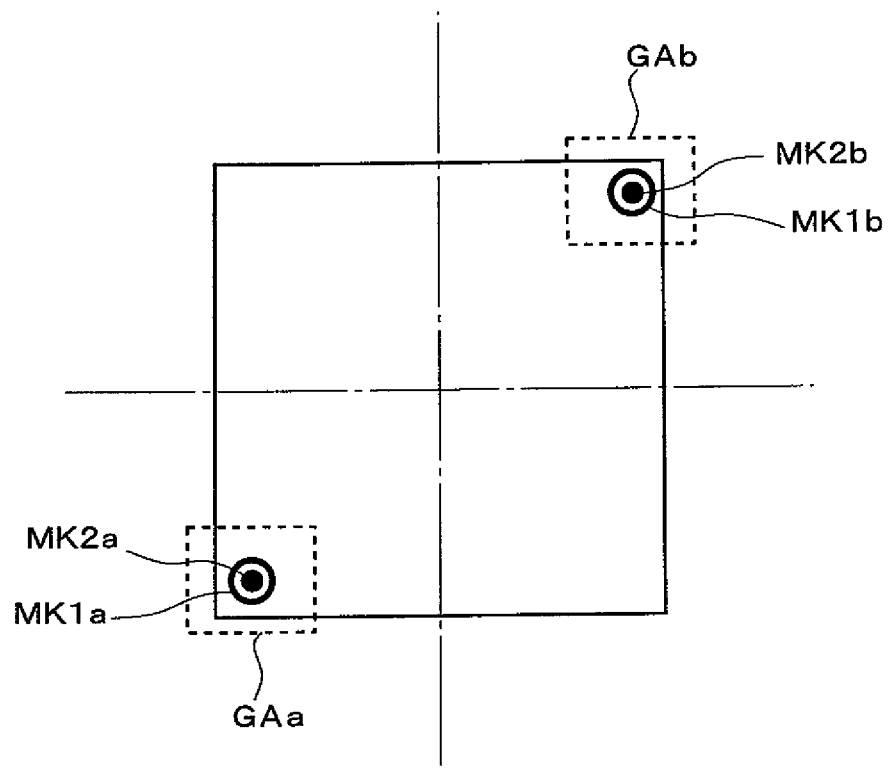
FIG. 6 is a diagram showing a captured image of the objects to be bonded.
Figure 7:
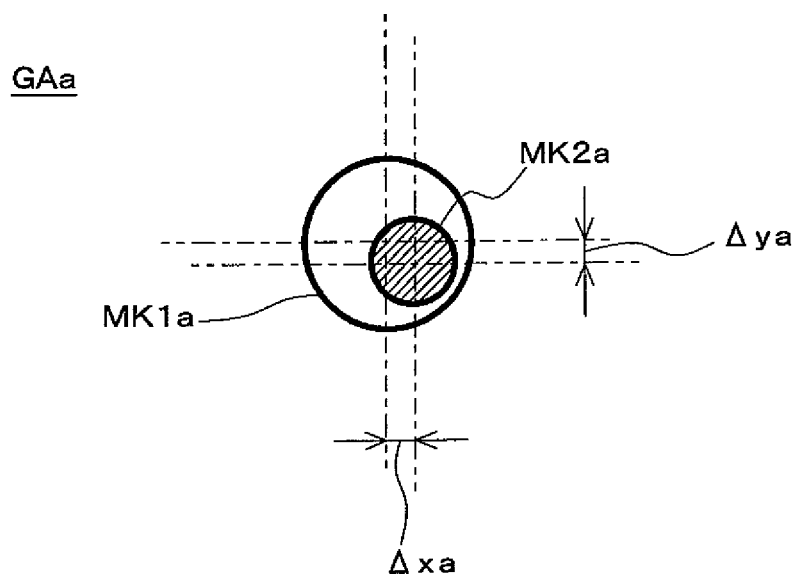
FIG. 7 is a diagram illustrating a state in which a pair of marks are shifted from each other.

More specifically, as shown in FIG. 1, light emitted from the light source (not shown) of the coaxial illumination system of the image capturing unit 28M is reflected by a mirror 28e and changes direction to travel upward. The light is further transmitted through the window 2b (FIG. 1) and a part (or the entirety) of the objects to be bonded 91 and 92, then reflected by the marks MK1a and MK2a of the objects to be bonded 91 and 92, and this time travels in the opposite direction (downward). The light is then transmitted again through the window 2b and reflected by the mirror 28e where the travelling direction is changed to the left, and reaches an image sensor in the image capturing unit 28M. The position recognition unit 28 acquires the optical image (image including the marks MK1a and MK2a) of the objects to be bonded 91 and 92 as a captured image GAa (see FIG. 6) in this way and recognizes the positions of a given set of the marks (MK1a and MK2a) added to the objects to be bonded 91 and 92 based on the image GAa, as well as obtaining positional shift amounts (Δxa and Δya) between the marks (MK1a and MK2a) of that set (see FIG. 7). FIG. 7 is a diagram showing a state in which the marks MK1a and MK2a of a given set are shifted from each other.

Similarly, light emitted from the light source (not shown) of the coaxial illumination system of the image capturing unit 28N is reflected by the mirror 28f where the travelling direction of the light is changed, and travels upward. The light is further transmitted through the window 2b (FIG. 1) and a part or the entirety of the objects to be bonded 91 and 92 and reflected by the marks MK1b and MK2b of the objects to be bonded 91 and 92, and this time travels in the opposite direction (downward). The light is then transmitted again through the window 2b and reflected by the mirror 28f where the travelling direction of the light is changed to the right, and reaches an image sensor in the image capturing unit 28N. The position recognition unit 28 acquires the optical image (image including the marks MK1*b* and MK2*b*) of the objects to be bonded 91 and 92 as a captured image GAb (see FIG. 6) in this way and recognizes the positions of the other set of the marks (MK1*b* and MK2*b*) added to the objects to be bonded 91 and 92 based on the image GAb, as well as obtaining positional shift amounts (Δxb and Δyb) between the marks (MK1*b* and MK2*b*) of that set. Note here that the operations of the image capturing units 28M and 28N acquiring the captured images GAa and GAb are executed substantially at the same time.

Thereafter, the position recognition unit 28 calculates relative shift amounts (specifically, Δx, Δy, and Δθ) in the X, Y, and θ directions between the objects to be bonded 91 and 92, based on the positional shift amounts (Δxa, Δya) and (Δxb, Δyb) obtained for these two sets of the marks and the geometrical relationship between the two sets of the marks. Then, the head 22 is driven in the two translational directions (X and Y directions) and the rotation direction (θ direction) so as to reduce the relative shift amounts ΔD recognized by the position recognition unit 28. As a result, the objects to be bonded 91 and 92 are moved relative to each other, and the above-described positional shift amounts ΔD are corrected.

As described above, the positional shift amounts ΔD (specifically, Δx, Δy, and Δθ) in the plane (horizontal plane) perpendicular to the vertical direction (Z direction) are measured, and the alignment operation (fine alignment operation) of correcting the positional shift amounts ΔD is executed. As will be discussed later, the operation of measuring the positional shift amounts ΔD is executed in not only a state in which the objects to be bonded 91 and 92 are not in contact with each other, but also a state in which the objects to be bonded 91 and 92 are in contact with each other.

Note here that although the case where the two captured images GAa and GAb are acquired in parallel (substantially at the same time) using the two cameras 28M and 28N is given as an example, the present invention is not limited thereto. For example, the captured images GAa and GAb may be acquired successively by moving a single camera 28M in the X and/or Y direction(s).

1-3. Bonding Operation

Figure 8:
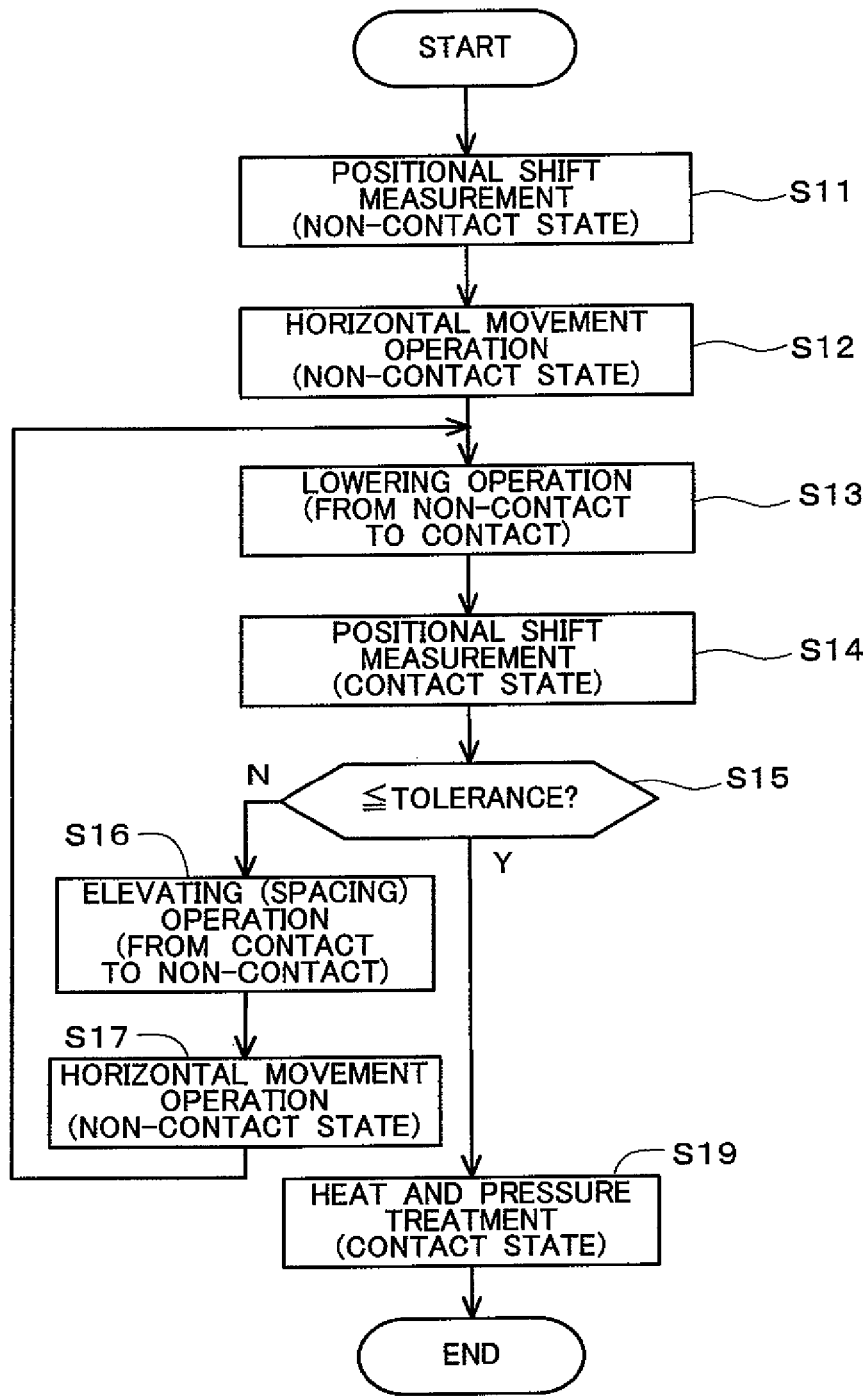
FIG. 8 is a flowchart showing an operation according to a first embodiment.

Next is a description of an operation according to the first embodiment with reference to FIG. 8. FIG. 8 is a flowchart showing the operation according to first embodiment. This operation is controlled by a controller 100 (see FIG. 1) in the apparatus 1.

In FIG. 8, it is assumed that the aforementioned pre-alignment operation (rough alignment operation) has already been executed. After the pre-alignment operation, the objects to be bonded 91 and 92 are disposed facing each other in a non-contact state.

Thereafter, the fine alignment operation (described above) is further executed in the non-contact state in steps S11 and S12.

Specifically, the captured images GAa and GAb (see FIG. 6) of the objects to be bonded 91 and 92 (see FIG. 9) in the non-contact state are acquired in step S11. Then, the positional shift amounts (Δx, Δy, and Δθ) in the X, Y, and θ directions between the objects to be bonded 91 and 92 are obtained based on the two captured images GA and GAb.

To be more specific, shift amounts (Δxa and Δya) are calculated using a vector correlation method based on the image GAa obtained by simultaneously reading the marks MK1*a* and MK2*a* that are spaced from each other in the Z direction. Similarly, shift amounts (Δxb and Δyb) are calculated using a vector correlation method based on the image GAb obtained by simultaneously reading the marks MK1*b* and MK2*b* that are spaced from each other in the Z direction. Then, the positional shift amounts (Δx, Δy, and Δθ) in the horizontal direction between the objects to be bonded 91 and 92 are measured based on the shift amounts (Δxa and Δya) and the shift amounts (Δxb and Δyb). Note that, as will be discussed later, the positions can be obtained with higher accuracy if the image GAa including the marks MK1*a* and MK2*a* spaced from each other in the Z direction is analyzed using the vector correlation method. The same applies for the image GAb.

Thereafter, the objects to be bonded 91 and 92 are moved relative to each other so as to correct the positional shift amounts (Δx, Δy, and Δθ) in step S12. Specifically, with the stage 12 fixed, the head 22 is moved in the X, Y, and θ directions so as to eliminate the positional shift amounts (Δx, Δy, and Δθ). As a result, the objects to be bonded 91 and 92 are horizontally aligned with extremely high accuracy (e.g., within a tolerance of 0.2 micrometers). FIG. 9 is a schematic diagram showing such a state. That is, FIG. 9 shows a state in which the objects to be bonded 91 and 92 have a proper positional relationship in the horizontal direction. Note that in FIG. 9, the objects to be bonded 91 and 92 are spaced from each other in the vertical direction and are not yet in contact with each other.

Thereafter, in step S13, the head 22 is lowered by driving the Z-axis up-down drive mechanism 26 such that the objects to be bonded 91 and 92 are brought into contact with each other (see FIG. 10). FIG. 10 shows a situation in which the objects to be bonded 91 and 92 are in contact with each other while having a proper positional relationship in the horizontal direction. Note that in this case, the contact pressure between the objects to be bonded 91 and 92 is adjusted to a predetermined value (e.g., 0.1 N/mm$^2$) based on the result of detection by the pressure detection sensor 29 or the like.

Figure 13:
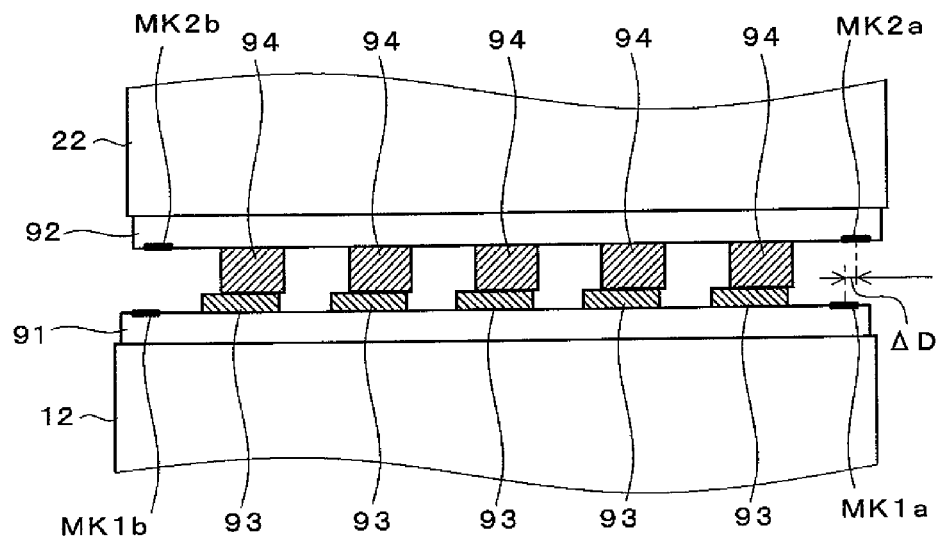
FIG. 13 is a diagram showing a situation in which two objects to be bonded are in contact with each other in a state following a horizontal positional shift therebetween.

However, in actuality, the objects to be bonded 91 and 92 often fail to have a proper positional relationship (FIG. 10) after such a contact operation, as shown in FIG. 13. Even if the objects to be bonded 91 and 92 have a proper positional relationship before their contact, such a positional shift that follows contact can occur due to factors such as the action of physical impact force generated when the objects to be bonded 91 and 92 are brought into contact with each other.

Figure 11:
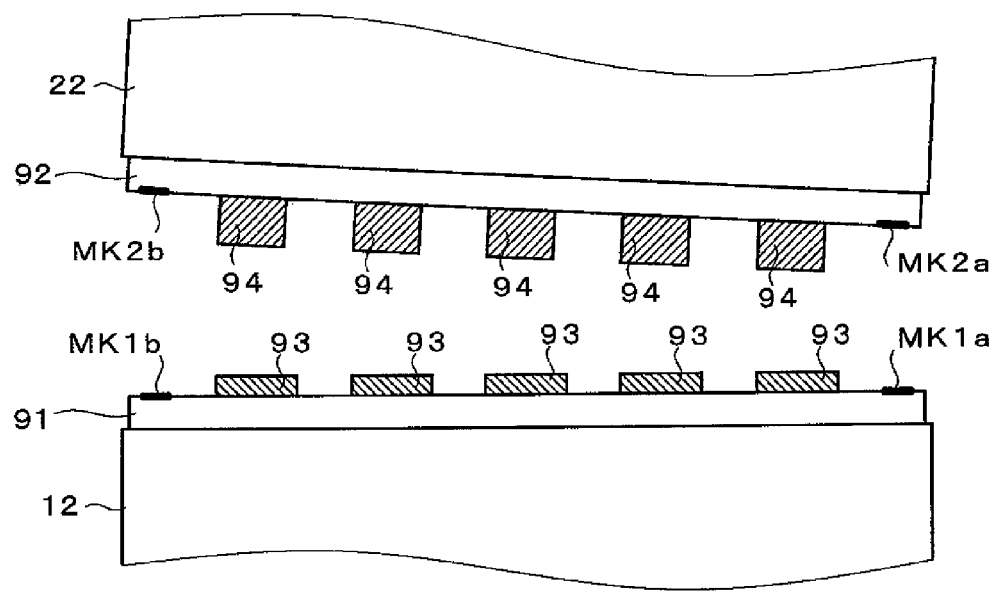
FIG. 11 is a diagram showing a situation in which two objects to be bonded are disposed at an angle to each other.

In particular, such a positional shift can occur due to the following factor. Specifically, the objects to be bonded 91 and 92 at a time prior to contact may be disposed in a state (a state in which the objects are disposed at an angle) that is different from an ideal state (a state in which the objects are disposed in parallel) as shown in FIG. 9. To be more specific, there is a case, as shown in FIG. 11, where the stage 12 and the head 22 (and by extension, the objects to be bonded 91 and 92) are disposed slightly at an angle to each other because the parallelism of the stage 12 and the head 22 is not enough.

Figure 12:
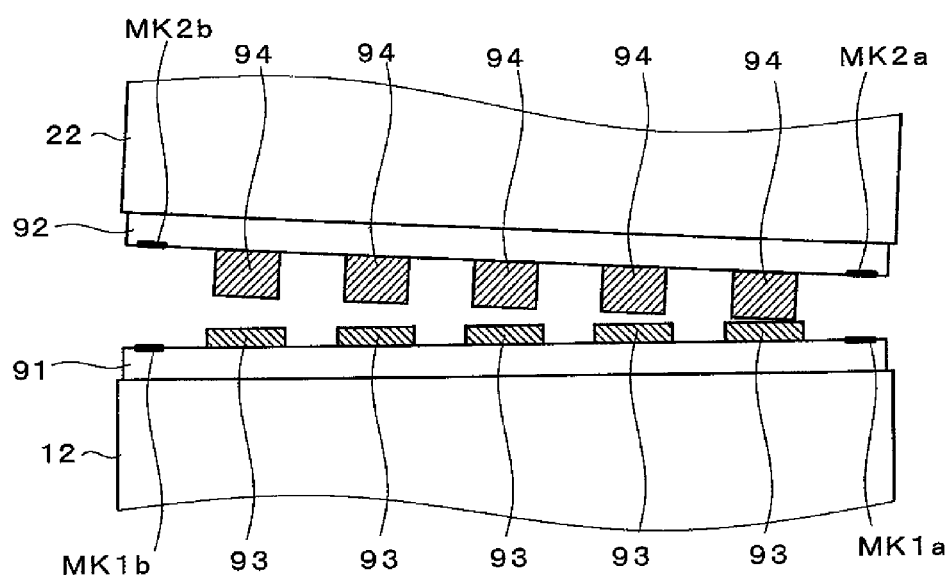
FIG. 12 is a diagram showing a situation in which two objects to be bonded start to come into contact with each other on one end side thereof.

In such a case, firstly, the object to be bonded 92 comes in contact with the object to be bonded 91 on one end side in a predetermined direction (e.g., the right side in the figure), following the downward movement of the object to be bonded 92, as shown in FIG. 12. Thereafter, the object to be bonded 92 moves in the horizontal direction (e.g., to the right side in the figure) with respect to the object to be bonded 91 along with a sliding motion at the portion where the objects are in contact, and at the same time, the object to be bonded 92 descends on the other end side (e.g., the left side in the figure). In this way, the relative postures of the objects to be bonded 91 and 92 change gradually so that the objects approach their parallel state, and the area of contact between the objects to be bonded 91 and 92 increases gradually. Note that, to be more specific, the contact operation and sliding motion of the objects to be bonded 91 and 92 are implemented by moving the metal bumps 94 of the object to be bonded 92 in contact with the pads 93 (of the object to be bonded 91) facing the metal bumps 94. As a result of these operations, the objects to be bonded 91 and 92 come into contact with each other in a state in which they have a positional shift in the horizontal direction as shown in FIG. 13.

Note here that the angled disposition of the objects to be bonded 91 and 92 is given as an example of factors of a positional shift. However, in actuality, a positional shift as described above can occur due to various factors even if the objects to be bonded 91 and 92 are not disposed at an angle to each other.

With the intention of resolving a post-contact positional shift as described above, the bonding apparatus 1 of the present embodiment measures a positional shift in the horizontal direction between the objects to be bonded 91 and 92, in a state in which the object to be bonded 91 and the object to be bonded 92 are in contact with each other. Then, the bonding apparatus 1 performs positioning of the objects to be bonded, by correcting that positional shift. With such an operation, it is possible to bond the objects to be bonded 91 and 92 together in a state in which the objects to be bonded 91 and 92 are even more accurately positioned in the horizontal direction.

Specifically, firstly, the captured images GAa and GAb (see FIG. 6) of the objects to be bonded 91 and 92 in a "contact state" (FIG. 13) are acquired in step S14 (FIG. 8). Then, the positional shift amounts ($\Delta x$, $\Delta y$, and $\Delta \theta$) in the X, Y, and $\theta$ directions between the objects to be bonded 91 and 92 are measured based on the two captured images GAa and GAb.

Here, in the contact state of the objects to be bonded 91 and 92 (step S14), the pads 93, which are raised portions on the surface of the object to be bonded 91, and the metal bumps 94, which are raised portions on the surface of the object to be bonded 92, are in contact with each other. On the other hand, the marks MK1 provided on non-raised portions of the surface of the object to be bonded 91 and the marks MK2 provided on non-raised portions of the surface of the object to be bonded 92 are spaced from each other in the Z direction as shown in FIG. 9 (or FIG. 11) or the like.

Then, also in step S14, similarly to step S11, the shift amounts ($\Delta xa$, $\Delta ya$) are calculated using a vector correlation method based on the image GAa obtained by simultaneously reading the two marks MK1a and MK2a that are spaced from each other in the Z direction. Similarly, the shift amounts ($\Delta xb$, $\Delta yb$) are calculated using a vector correlation method based on the image GAb obtained by simultaneously reading the two marks MK1b and MK2b that are spaced from each other in the Z direction. Then, the positional shift amounts ($\Delta x$, $\Delta y$, and $\Delta \theta$) in the horizontal directions between the objects to be bonded 91 and 92 are measured based on the shift amounts ($\Delta xa$, $\Delta ya$) and the shift amounts ($\Delta xb$, $\Delta yb$).

Thereafter, if it is determined in step S15 that the positional shift amounts fall within predetermined tolerances, the procedure proceeds to step S16. Note that whether or not the positional shift amounts fall within predetermined tolerances may be determined based on, for example, whether or not the condition that all of the three positional shift amounts ($\Delta x$, $\Delta y$, and $\Delta \theta$) fall within their respective tolerances is met.

Figure 14:
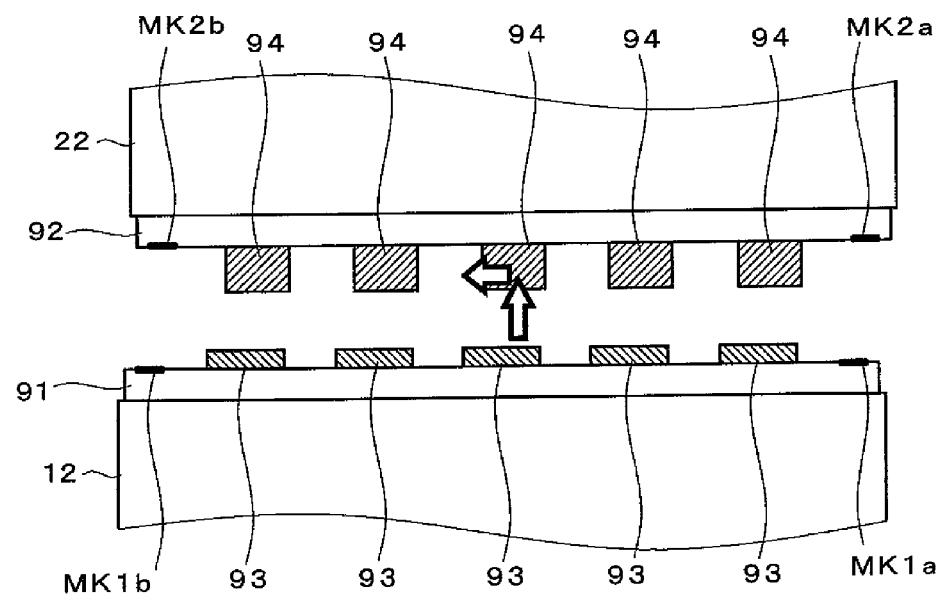
FIG. 14 is a diagram showing a situation in which an alignment operation is performed after a state of contact between two objects to be bonded is temporarily released.

In step S16, the objects to be bonded 91 and 92 are moved relatively away from each other in the Z direction, so that the contact state of the objects to be bonded 91 and 92 is temporarily released (see FIG. 14). To be more specific, the contact state of the objects to be bonded 91 and 92 is released by elevating the head 22.

Then, in step S17, a positioning operation (alignment operation) is performed in the non-contact state of the objects to be bonded 91 and 92, that is, in a state in which the objects to be bonded 91 and 92 are freely movable in the horizontal direction, by moving the objects to be bonded 91 and 92 relative to each other so as to correct the positional shift amounts ($\Delta x$, $\Delta y$, and $\Delta \theta$) (see FIG. 14). Specifically, with the stage 12 fixed, the head 22 moves in the X, Y, and $\theta$ directions so as to eliminate the positional shift amounts ($\Delta x$, $\Delta y$, and $\Delta \theta$) (see the left arrow in FIG. 14).

Thereafter, the procedure returns to step S13, in which the bonding apparatus 1 lowers the head 22 by driving the Z-axis up-down drive mechanism 26 such that the objects to be bonded 91 and 92 are again brought into contact with each other.

Then, the operation in step S14, that is, the operation of measuring a positional shift between the objects to be bonded 91 and 92 in the contact state, is performed again, and thereafter the procedure proceeds to step S15.

By executing the operations as described above (in particular, the operation of measuring a positional shift in the contact state and the correction operation of correcting a positional shift) once or repeatedly multiple times at a predetermined interval (e.g., one second) or the like, it is possible to reduce a positional shift due to the contact operation itself between the objects to be bonded 91 and 92. Accordingly, the objects to be bonded 91 and 92, even in the final state after their contact, are horizontally aligned with extremely high accuracy (e.g., within a tolerance of 0.2 micrometers) (see FIG. 10).

If it is determined in step S15 that a positional shift between the objects to be bonded 91 and 92 falls within tolerance, the procedure proceeds to step S19.

In step S19, pressure as well as heat are applied to the objects to be bonded 91 and 92, as a result of which the objects to be bonded 91 and 92 are bonded together. Specifically, the metal bumps 94 of the object to be bonded 92 are heated and melt and thereby bonded to the pads 93 of the object to be bonded 91 in a state in which the metal bumps 94 are in contact with the pads 93. Thereafter, the state of applying pressure is released after the metal bumps 94 are solidified with the elapse of an appropriate cooling period. In this way, the objects to be bonded 91 and 92 are favorably aligned with and bonded to each other.

As described above, with the operations of the present embodiment, it is possible to align the objects to be bonded 91 and 92 with extremely high accuracy because an actual positional shift in the contact state is measured and an alignment operation is performed so as to correct that positional shift. As a result, devices (semiconductor devices) or the like that are configured by the objects to be bonded 91 and 92 and the like can be manufactured with extremely high precision.

Furthermore, as mentioned above, the captured image GAa including both the alignment mark MK1a added to the object to be bonded 91 and the alignment mark MK2a added to the object to be bonded 92 is acquired in steps S11 and S14 described above (see FIGS. 4 to 6). Similarly, the captured image GAb including both the alignment mark MK1b added to the object to be bonded 91 and the alignment mark MK2b added to the object to be bonded 92 is acquired. Then, a positional shift between the objects to be bonded 91 and 92 is measured based on these captured images GA and GAb.

Here, the captured image GAa for position measurement is an image acquired by simultaneously reading the alignment mark MK1a added to the object to be bonded 91 and the alignment mark MK2a added to the object to be bonded 92. Similarly, the captured image GAb for position measurement is an image acquired by simultaneously reading the alignment mark MK1b added to the object to be bonded 91 and the alignment mark MK2b added to the object to be bonded 92.

If two alignment marks are separately read as two different images, an error in the relative positions of the two images due to, for example, a matching error between the coordinate systems of the images can occur when detecting a positional shift between the two alignment marks. For example, in the case where the alignment mark MK1a added to the object to be bonded 91 is acquired as an image GC and the alignment mark MK2a added to the object to be bonded 92 is read in another image GD, an error in shift amount between the two alignment marks MK1a and MK2a can occur due to, for example, a matching error between the coordinate system of the image GC and the coordinate system of the image GD. In particular, since the two images GC and GD are acquired at different points in time, an error can also occur because the relative positional relationship between the two alignment marks MK1a and MK2a cannot be accurately grasped due to various types of vibrations or like.

In contrast, with the example given in the above-described embodiment, the captured image GAa is an image acquired by simultaneously reading the alignment marks MK1a and MK2a added to the objects to be bonded 91 and 92. Accordingly, using that image GAa enables the occurrence of an error as described above to be prevented. The same applies for the image GAb.

Furthermore, in the above-described embodiment, in steps S11 and S14, the captured image GAa is acquired in a state in which the alignment marks MK1a and MK2a are spaced from each other in the Z direction, and the edges of the portions corresponding to the alignment marks MK1a and MK2a in the captured image GAa are detected using the vector correlation method.

Figure 15:
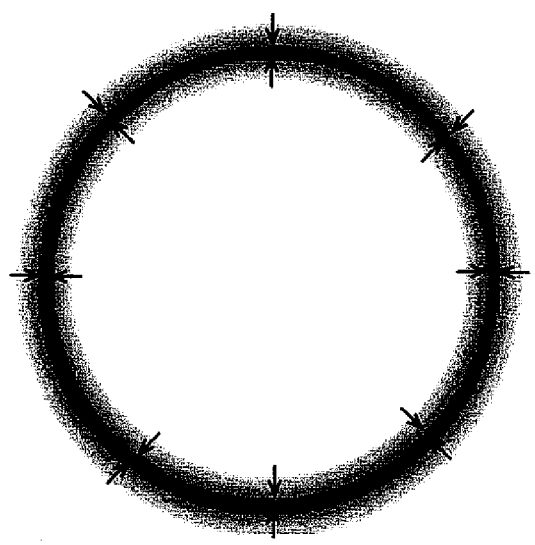
FIG. 15 is a diagram showing a captured image of a mark acquired with a small amount of blurring.
Figure 16:
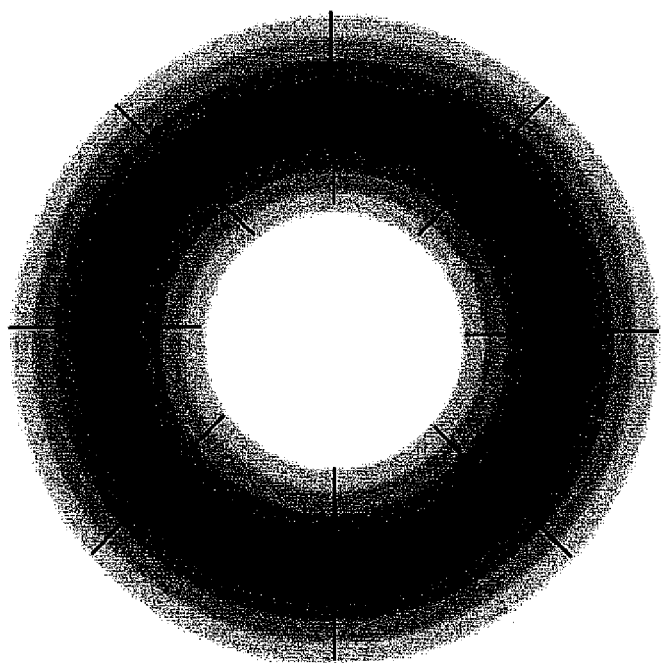
FIG. 16 is a diagram showing a captured image of a mark acquired with a relatively large amount of blurring.

FIG. 15 is a schematic diagram showing the mark MK1a in a captured image (of a circular shape) acquired with a small amount of blurring, and FIG. 16 is a schematic diagram showing the mark MK1a in a capture image (of a circular shape) acquired with a relatively large amount of blurring. With the vector correlation method according to the present embodiment, a feature amount of an edge graphic (e.g., grayscale information (direction of grayscale transitions) on an edge portion) is acquired in a vectorized form. Specifically, vectors each indicating a change in gradation from white to black are generated. More specifically, a vector directing from white to black is generated at each portion of the ring-shaped mark MK1a. For example, as can be seen from the comparison between FIG. 15 and FIG. 16, although the length of each vector in the case of a relatively large degree of blurring (FIG. 16) is greater than that of each corresponding vector in the case of a relatively small degree of blurring (FIG. 15), the orientation of each vector in FIG. 16 is the same as that of the corresponding vector in FIG. 15. Then, a comparison operation is executed, using primarily information about the "orientations" of the vectors at the edge portions in the images of the marks MK1a and MK2a. Accordingly, the influence of the degree of blurring of the image is reduced as compared with the case where the images of the marks MK1a and MK2a are compared on a pixel by pixel basis.

As described above, using the vector correlation method enables the influence of the degree of blurring of images to be reduced and accordingly enables the positions of the alignment marks to be detected with great accuracy. The same applies for the captured image GAb.

Furthermore, the image capturing units 28M and 28N of the above-described embodiment each include a focal-position adjustment mechanism for adjusting a position where light from an object forms an image. Such a focal-position adjustment mechanism is capable of capturing an image of an object present at a predetermined subject distance in an in-focus state by moving the lens position of a photographing lens so that light from the object forms an image on an image capturing plane. The captured images GAa and GAb are each acquired in, for example, the following in-focus state.

Figure 17:
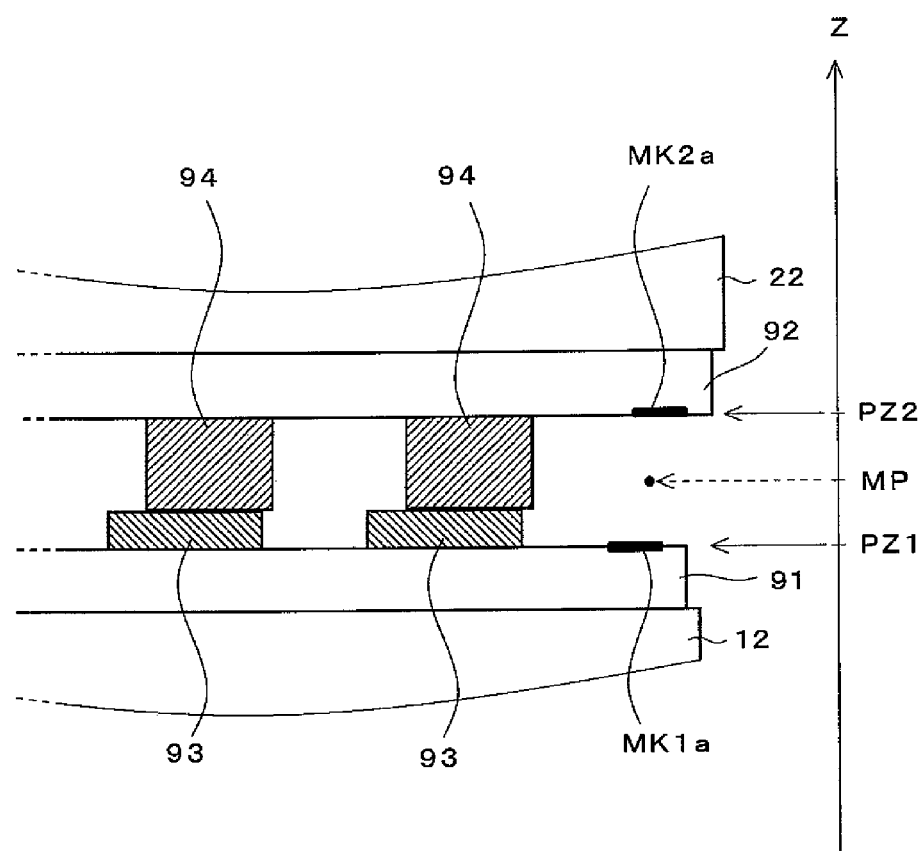
FIG. 17 is a diagram illustrating an in-focus state at the time of capturing alignment marks.

Specifically, the captured image GAa is acquired in a state in which light from a virtual object present at a Z-direction position MP (see FIG. 17) between a Z-direction position PZ1 (PZ1a) of the alignment mark MK1a and a Z-direction position PZ2 (PZ2a) of the alignment mark MK2a forms an image on the image capturing plane of the image capturing unit 28M. Similarly, the captured image GAb is acquired in a state in which light from a virtual object present at a Z-direction position MP between a Z-direction position PZ1 (PZ1b) of the alignment mark MK1b and a Z-direction position PZ2 (PZ2b) of the alignment mark MK2b forms an image on the image capturing area of the image capturing unit 28M.

By focusing on a point (preferably, the midpoint (middle)) between the alignment marks MK1a and MK2a in this way, it is possible to balance the degrees of blurring of the alignment marks MK1a and MK2a (to prevent one of the marks from being blurred to a much greater degree) and to thereby detect a positional shift with high accuracy.

Furthermore, in the above-described embodiment, the contact operation in step S13 is (often) repeatedly executed multiple times on the objects to be bonded 91 and 92 (specifically, the pads 93 and the metal bumps 94) that have undergone surface activation processing. With this contact operation (pressure contact operation), an unnecessary re-adsorption layer present at the interface of bonding is broken through and removed, and therefore excellent activated bonding with reduced voids can be achieved at the interface of bonding. More specifically, excellent bonding is achieved by breaking through and removing such a re-adsorption layer along with the contact operation and thereby causing a new surface under the re-adsorption layer to be exposed.

In general, two bonding surfaces each have relatively large irregularities in microscopic view and are in contact with each other at a relatively small number of points. To break through the re-adsorption layer with only a single contact operation, a relatively high pressure is required because the re-adsorption layer needs to be broken through with a relatively small number of points (e.g., one point).

In contrast, in the above-described embodiment, in the case where the contact operation in step S13 is repeatedly executed multiple times, the re-adsorption layer is broken through and removed at a large number of points with the re-contact operation of the objects to be bonded 91 and 92 (step S13). This increases the number of contact points between the bonding surfaces of the objects and enables the objects to be bonded 91 and 92 to be in contact with each other at a large number of points. For example, the objects to be bonded 91 and 92 are in contact with each other at a relatively larger number of points immediately after the second contact operation, rather than immediately after the first contact operation. Accordingly, new surfaces are exposed at a large number of points, and as a result, excellent bonding is achieved. In addition, excellent bonding is possible with a relatively lower pressure (contact pressure) than in the case where only a single contact operation is performed.

2. Second Embodiment

A second embodiment is a variation of the first embodiment. The following description focuses on differences from the first embodiment.

In the second embodiment, a case is illustrated in which an operation of adjusting parallelism is also performed in accordance with the post-contact measurement of a positional shift.

As mentioned above, there are cases where the stage 12 and the head 22 are disposed at an angle to each other, and by extension, the objects to be bonded 91 and 92 are disposed at an angle to each other (not in parallel with each other) as shown in FIG. 10, because the parallelism of the stage 12 and the head 22 is not enough. A shift or the like in the contact state may increase due to such an angled disposition.

Figure 18:
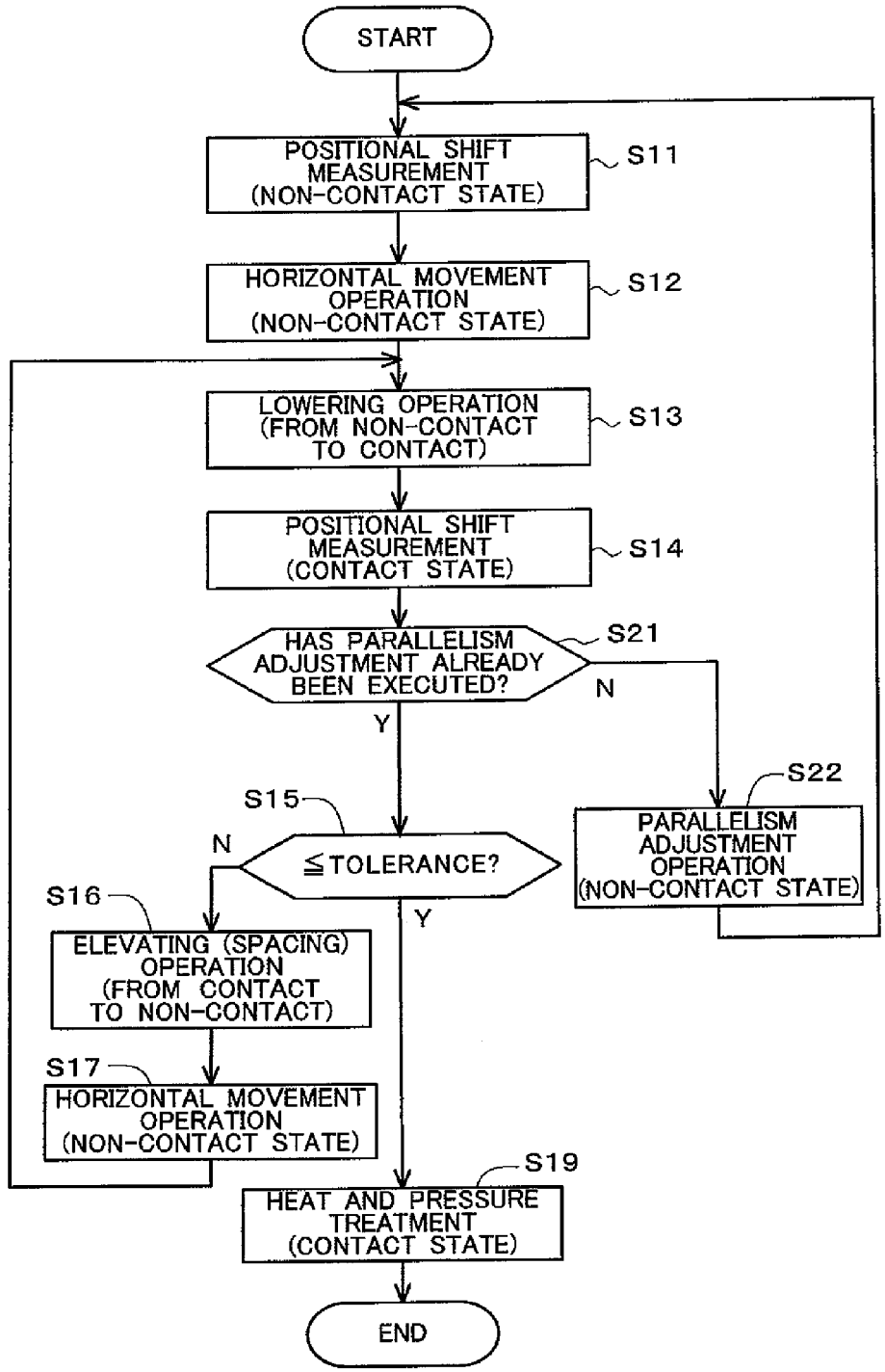
FIG. 18 is a flowchart showing an operation according to a second embodiment.

In view of this, in the second embodiment, the parallelism adjustment operation is also executed in accordance with the post-contact positional shift measurement. Specifically, as shown in FIG. 18, the parallelism adjustment operation (step S22) is executed only once in accordance with the post-contact positional shift measurement (step S14). Note that FIG. 18 is a flowchart showing an operation according to the second embodiment.

To be more specific, an operation of determining whether or not the parallelism adjustment operation (step S22) has already been executed is performed in step S21 following step S14. If the parallelism adjustment operation has already been executed, the procedure proceeds from step S21 to step S15. If the parallelism adjustment operation has not yet been executed, the procedure proceeds from step S21 to step S22. Here, it is assumed that the parallelism adjustment operation has not yet been executed and the procedure proceeds to step S22.

Figure 19:
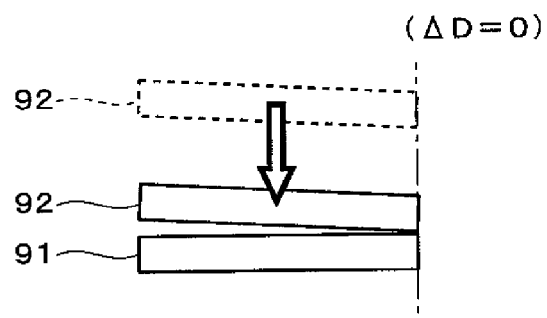
FIG. 19 is a schematic diagram illustrating a contact operation in a state following deviation in parallelism.
Figure 20:
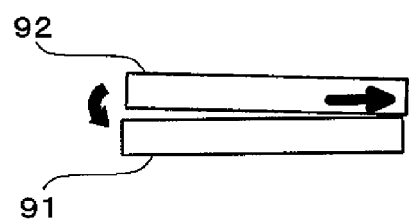
FIG. 20 is a schematic diagram illustrating a contact operation performed while accompanying deviation in parallelism.
Figure 21:
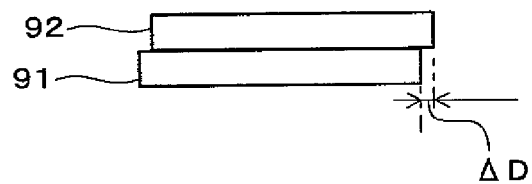
FIG. 21 is a diagram illustrating a contact operation performed while accompanying deviation in parallelism.

FIGS. 19 to 21 are schematic diagrams showing the contact operation (step S13) performed in a state that involves deviation in parallelism. The operation in step S22 and the like will be described below with reference to these figures.

After the object to be bonded 92 that is inclined to the right as shown in FIG. 19 (see also FIG. 12) comes into contact with the object to be bonded 91 on the right side in the figures, the inclination angle between the objects to be bonded 91 and 92 decreases with a sliding motion of the objects at the portion where the objects are in contact with each other, and the objects to be bonded 91 and 92 are gradually brought into contact with each other (see FIG. 20). Ultimately, in a state in which the objects to be bonded 91 and 92 are disposed in parallel and in contact with each other, a horizontal positional shift between the objects to be bonded 91 and 92 reaches a value $\Delta D$ as shown in FIG. 21 (see also FIG. 13).

Here, assuming that there was no error $\Delta D$ (also denoted by $\Delta D0$) ($\Delta D0=0$) in the positional shift measurement operation performed in the non-contact state (step S11), it is conceivable that a measurement result AD (also denoted by $\Delta D1$) obtained by the positional shift measurement operation performed in the contact state (step S14) shows a positional shift amount that accompanies the sliding motion between the opposing surfaces. Thus, a difference ($\Delta D1-\Delta D0$) between the positional shift $\Delta D0$ between the objects to be bonded 91 and 92 in the "non-contact state" and the positional shift $\Delta D1$ between the objects to be bonded 91 and 92 in the "contact state" is obtained as a positional shift amount DD that accompanies the sliding motion involved when the objects to be bonded 91 and 92 are brought into contact with each other.

Figure 22:
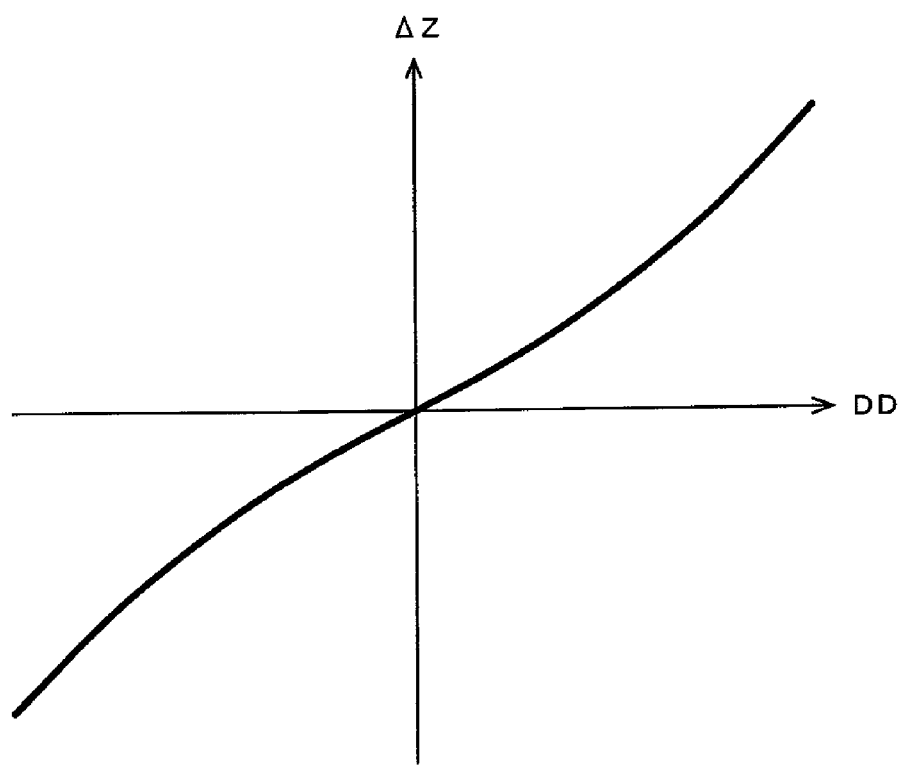
FIG. 22 is a diagram showing the relationship between a horizontal positional shift amount $\Delta D$ and a Z-position correction amount $\Delta Z$.

Such a horizontal positional shift amount DD has a predetermined relationship with the inclination angle of the object to be bonded 92, in other words, a Z-direction shift amount $\Delta Z$ at an edge position of the object to be bonded 92. FIG. 22 is a diagram showing the relationship between the positional shift amount DD and the Z-direction displacement amount $\Delta Z$. Note that the relationship shown in FIG. 22 may be obtained in advance by experiment or the like.

Specifically, the positional shift amount DD that accompanies contact increases with increasing pre-contact Z-direction displacement amount (comparative displacement from that in a parallel state) $\Delta Z$ at a predetermined position (right edge position in the figure) of the object to be bonded 92. In other words, the positional shift amount DD increases with increasing angle of inclination of the object to be bonded 92 to the object to be bonded 91. That is, the greater the pre-contact inclination angle between the objects to be bonded 91 and 92, the more the objects to be bonded 91 and 92 are will shift at the time of contact.

In the present embodiment, the parallelism of the objects to be bonded 91 and 92 is adjusted based on the relationship between the positional shift amount DD and the displacement $\Delta Z$ (FIG. 22) in step S22. Specifically, the Z-direction displacement $\Delta Z$ of the head 22 at a position on one end side in the X direction is changed by appropriately adjusting the amounts of extension of the three piezoelectric actuators 31 (31a, 31b, and 31c). The posture of the object to be bonded 92 relative to the objects to be bonded 91 and 92 is changed by, for example, elevating the right edge position of the object to be bonded 92 by the value $\Delta Z$ in the X direction as compared with the left edge position thereof. A similar posture adjustment operation may also be performed in the Y direction. In this way, the posture of the head 22 is changed so as to eliminate the displacement $\Delta Z$ corresponding to the positional shift amount DD.

By changing the inclination angle of the head 22 using the piezoelectric actuators 31 in this way, the parallelism of the head 22 with respect to the stage 12 is adjusted. As a result, the parallelism of the objects to be bonded 91 and 92 in the non-contact state is adjusted.

Note that adjusting the parallelism of the objects to be bonded 91 and 92 using the relationship between the positional shift amount DD and the displacement $\Delta Z$ can also be expressed to be measuring (estimating) the parallelism of objects to be bonded immediately before their contact, based on a positional shift between the objects to be bonded in the non-contact state and a positional shift between the objects to be bonded in the contact state, and then controlling (adjusting) the parallelism of the objects to be bonded, based on the measurement result (estimation result).

Such a parallelism adjustment operation is executed in step S22 in FIG. 18. Then, after the parallelism of the objects to be bonded 91 and 92 has approximated its ideal state, the alignment operation in the non-contact state in steps S11 and S12 is again performed. Thereafter, the contact operation in step S13 is again performed.

When the objects to be bonded 91 and 92 are again brought into contact with each other (step S13) after the parallelism adjustment operation (step S22), an error due to the fact that the objects to be bonded 91 and 92 are not in parallel with each other will be reduced. Accordingly, the positional shift amounts measured in the next step S14 are reduced as well. If it is determined in step S21 that the parallelism adjustment operation has already been executed, the procedure proceeds from step S21 to step S15. In step S15 and the following steps, operations similar to those of the first embodiment are performed.

With the above-described operations, effects that are similar to those of the first embodiment can be achieved. In particular, in the second embodiment, in step S22, the parallelism of the objects to be bonded immediately before their contact is estimated based on the positional shift between the objects to be bonded in the non-contact state and the positional shift between the objects to be bonded in the contact state, and the parallelism of the objects to be bonded is controlled based on the estimation result. Thereafter, the objects to be bonded 91 and 92 are again brought into contact with each other. Accordingly, it is possible to prevent needless force generated due to the fact that objects are not in parallel with each other from acting on the objects at the time of their contact (re-contact) and accordingly to reduce, in particular, post-contact (post-re-contact) positional shift amounts.

Note that in the second embodiment, the case is illustrated in which the parallelism adjustment operation in step S22 is performed only once (depending on the determination operation in step S21), but the present invention is not limited thereto. For example, the parallelism adjustment operation may be repeated several times. In this case, it is possible to gradually reduce an error in parallelism.

3. Third Embodiment

In the first embodiment, the case is illustrated in which the objects to be bonded 91 and 92 are temporarily brought out of contact with each other by temporarily elevating the object to be bonded 92 in order to eliminate a post-contact positional shift, but the present invention is not limited thereto. For example, the positioning of the objects to be bonded 91 and 92 may be performed by correcting a positional shift between the objects to be bonded 91 and 92 while maintaining the contact state of the objects to be bonded 91 and 92. The description of a third embodiment gives such a variation, focusing on differences from the first embodiment.

Figure 23:
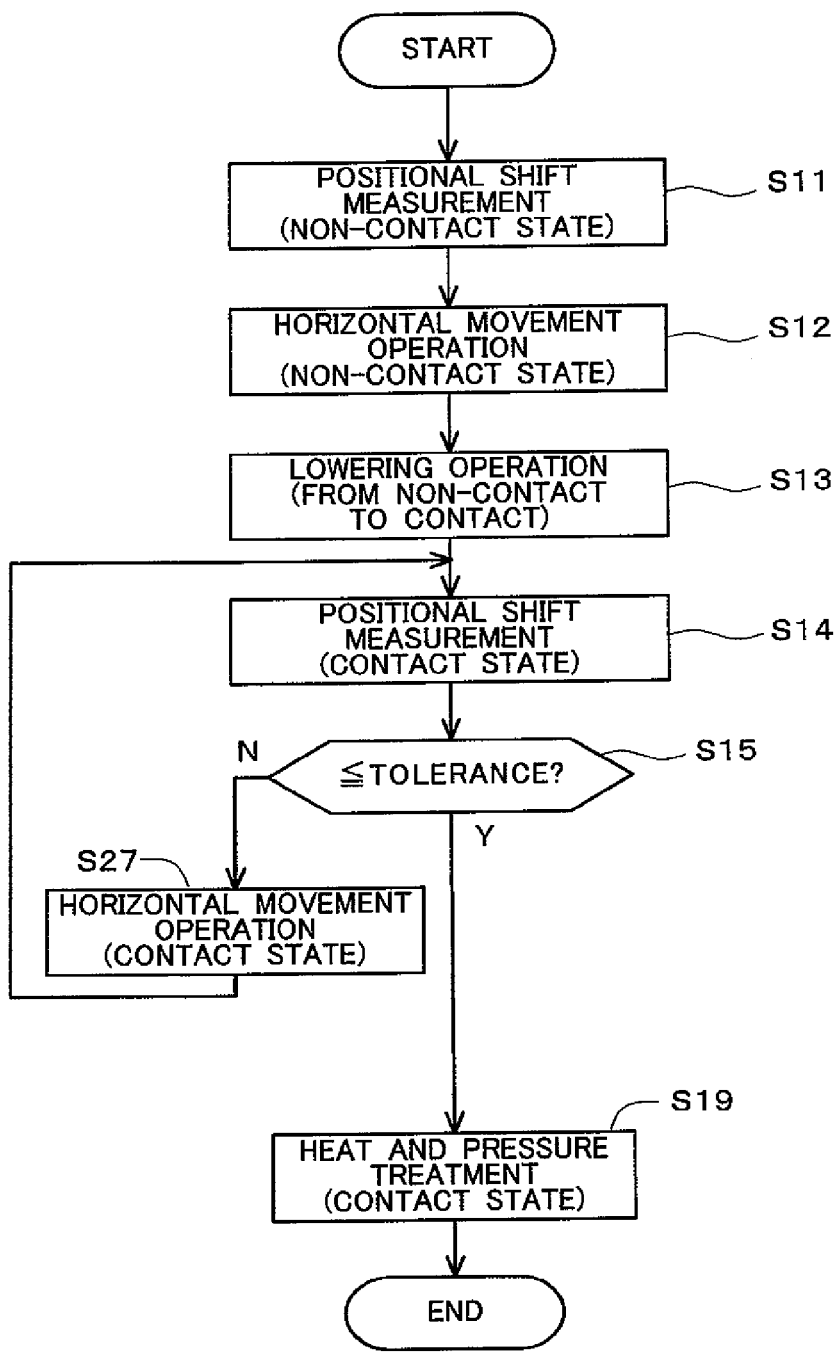
FIG. 23 is a flowchart showing an operation according to a third embodiment.

FIG. 23 is a flowchart showing an operation according to the third embodiment. As shown in FIG. 23, in the present embodiment, if it is determined that there is a positional shift of a predetermined amount or more (step S15), the procedure proceeds directly to step S27, without involving the contact release operation in step S16 (FIG. 8).

Figure 24:
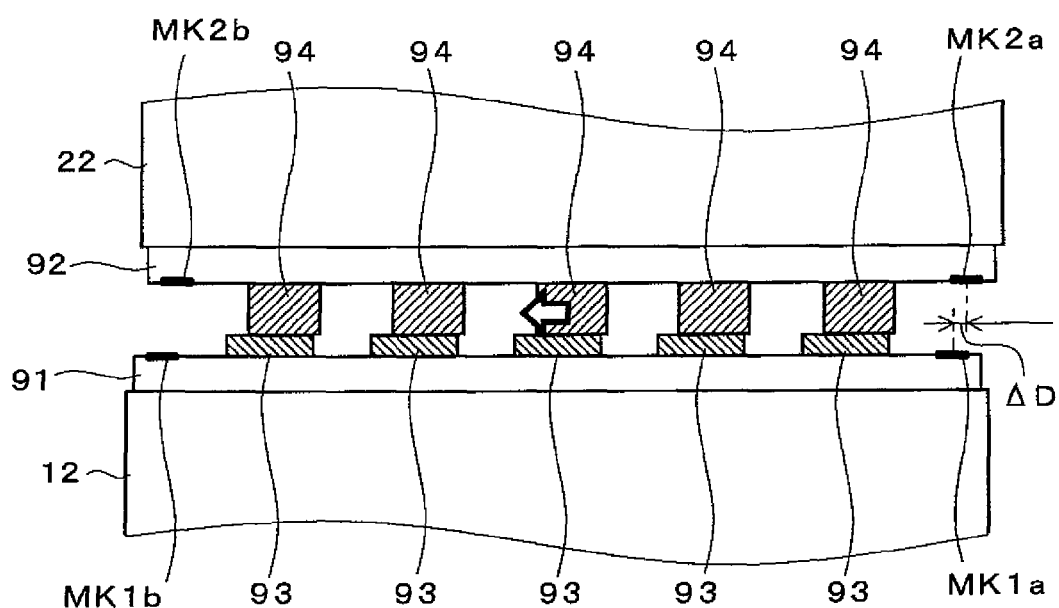
FIG. 24 is a diagram showing a situation in which a positional shift between two objects to be bonded is corrected while maintaining a state of contact therebetween.

In step S27, as shown in FIG. 24, horizontal positioning of the objects to be bonded 91 and 92 is performed while maintaining the contact state (pressure contact state) of the objects to be bonded 91 and 92. Specifically, the positioning operation (alignment operation) is performed by moving the head 22 in the horizontal direction (specifically, in the X, Y, and θ directions) so as to correct the positional shift amounts ($\Delta x$, $\Delta y$, and $\Delta \theta$) detected in step S14. As a result, the positional shift amounts ($\Delta x$, $\Delta y$, and $\Delta \theta$) are corrected.

Even with such an example, effects that are similar to those of the above-described first embodiment can be achieved. Furthermore, the time required for the operation of releasing the contact state can be saved because the alignment operation of correcting a positional shift is executed while maintaining the contact state of the objects to be bonded 91 and 92. Note that the example of the third embodiment is in particular useful for cases such as where the contact area between the objects to be bonded 91 and 92 is small (and/or the contact resistance is small) or where the objects to be bonded 91 and 92 are easy to move in the contact state.

Furthermore, in the third embodiment, the objects to be bonded 91 and 92 (specifically, the pads 93 and the metal bumps 94) that have undergone surface activation processing slide while maintaining their contact state. Executing such a sliding motion at least once (in particular, repeatedly multiple times) makes it possible to break through and remove an unnecessary re-adsorption layer at the interface of bonding along with the sliding motion and to thereby achieve excellent activated bonding with reduced voids at the interface of bonding. More specifically, as a result of the re-adsorption layer being broken through and removed along with the sliding motion, new surfaces under the re-adsorption layer are exposed, which enables excellent bonding to be achieved.

As mentioned above, two bonding surfaces generally have relatively large irregularities with a microscopic view and are in contact with each other at a relatively small number of points. To break through a re-adsorption layer with only application of vertical pressure without a sliding motion, a relatively high pressure is required because the re-adsorption layer needs to be broken through with a relatively small number of points (e.g., one point).

In contrast, in the above-described third embodiment, if the horizontal movement operation (pressure sliding motion) in step S27 is repeatedly performed, the re-adsorption layer will be broken through and removed at a larger number of points along with the sliding motion of the objects to be bonded 91 and 92. This increase the number of contact points between the bonding surfaces of the objects and enables the objects to be bonded 91 and 92 to be brought into contact with each other at a larger number of points. Such an operation enables new surfaces to be exposed at a large number of points, thus achieving excellent bonding. In addition, excellent bonding can be achieved with a relatively lower pressure (contact pressure) than in the case that involves no horizontal movement operation (pressure sliding motion).

4. Fourth Embodiment

In the above-described first and other embodiments, the case is illustrated in which the pads 93 and the metal bumps 94 after being positioned in their solid phase state, are heated and bonded to each other.

The description of a fourth embodiment illustrates a case in which, in a heat-melt state in which the pads 93 and the metal bumps 94 are in contact with each other and the metal bumps 94 are being heated and melted, positioning of the objects to be bonded 91 and 92 is performed by measuring and correcting a positional shift between the objects to be bonded 91 and 92, and after that positioning, the metal bumps 94 are cooled and solidified. That is, the case is described in which the alignment operation is executed in the heat-melt state of the metal bumps 94.

Figure 25:
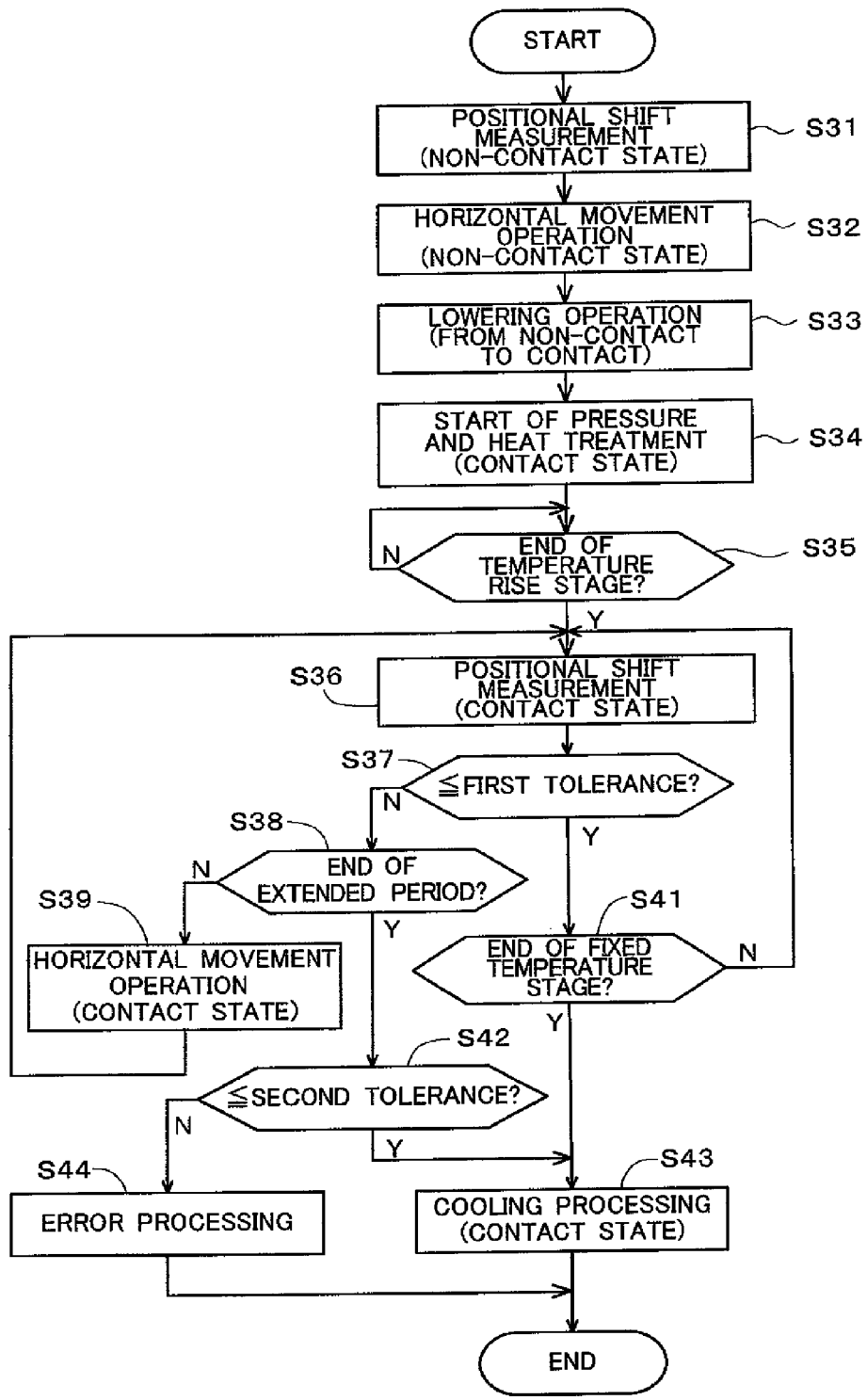
FIG. 25 is a flowchart showing an operation according to a fourth embodiment.

FIG. 25 is a flowchart showing an operation of the fourth embodiment. The following description is given with reference to FIG. 25, focusing on differences from the first embodiment.

Steps S31, S32, and S33 are operations respectively similar to those in steps S11, S12, and S13 (FIG. 8). In step S33, the objects to be bonded 91 and 92 are brought into contact with each other and pressure treatment is started (time T1), and in step S34, heat treatment is started.

Figure 26:
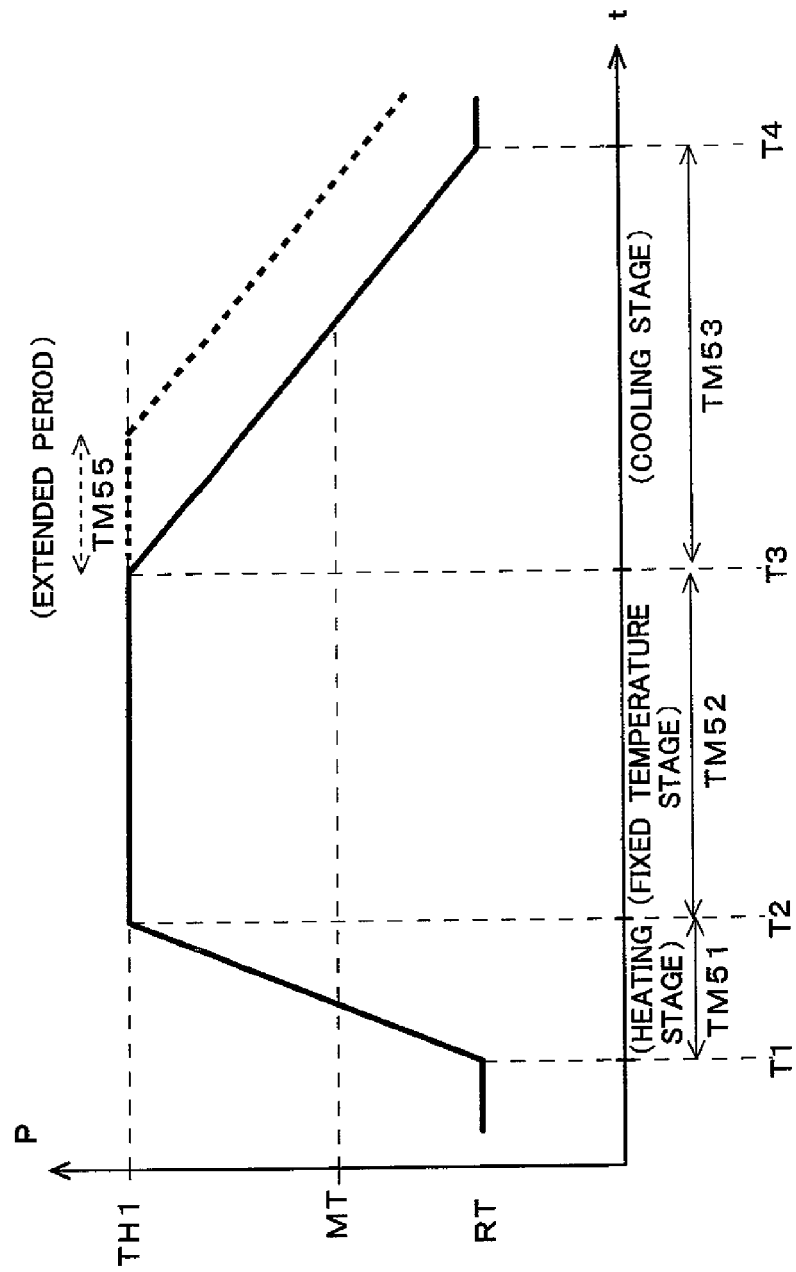
FIG. 26 is a diagram showing a change in the temperature of a head.

FIG. 26 is a diagram showing a temperature profile according to the present embodiment. As shown in FIG. 26, a period TM51 (e.g., approximately two seconds) from time T1 to time T2 is a temperature rise stage, and the temperature of the head 22 rises to a temperature TH1 during the period TM51. The temperature TH1 is a temperature higher than the melting point (melt temperature) MT of the metal bumps 94. A period TM52 (e.g., approximately five seconds) from time T2 to time T3 is a stage of maintaining temperature (fixed temperature stage), and the temperature of the head 22 is maintained at the temperature TH1 during the period TM52. A period TM53 (e.g., approximately 15 seconds) from time T3 to time T4 is a cooling stage, and the head 22 is cooled to approximately room temperature RT by an air-cooled cooling apparatus (cooling unit) or the like built in the head 22 during the period TM53.

In the fourth embodiment, in principle, a positional shift measurement operation and re-alignment processing are executed during the fixed temperature period TM52. If a positional shift amount ΔD falls within a first tolerance RG1 (described later) during the fixed temperature period TM52, cooling processing is executed immediately after the elapse of the period TM52 as shown in FIG. 26 (see the bold solid line in FIG. 26). On the other hand, if the positional shift amount does not fall within the first tolerance RG1 even after the fixed temperature period TM52 has elapsed, the positional shift measurement operation and the re-alignment processing continue to be performed over an extended period TM55 whose upper limit value is a predetermined period (e.g., three seconds) (see the sold broken line in FIG. 26). Then, if the positional shift amount ΔD falls within the first tolerance RG1 (described later) during the extended period TM55, cooling processing is immediately executed. Furthermore, if the positional shift amount ΔD falls within a second tolerance RG2 after the elapse of the extended period TM55, cooling processing is immediately started. On the other hand, if the positional shift amount ΔD does not fall within the second tolerance RG2 even after the extended period TM55 has elapsed, error processing (exception processing) is executed. Note that the second tolerance RG2 is set to be wider than the first tolerance RG1. For example, the first tolerance RG1 for the X-direction position is defined to be a range of −0.2 micrometers to +0.2 micrometers, and the second tolerance RG2 therefor is defined to be a range of −0.3 micrometers to +0.3 micrometers. Similarly, the first tolerances RG1 and the second tolerances RG2 for the Y-direction position and the θ-direction position are also defined.

In step S35, standby processing is executed until the temperature rise stage has ended (in other words, until the period TM51 has elapsed). During the standby processing period in step S35, processing at the temperature rise stage in FIG. 26, that is, processing for heating and melting the metal bumps 94, is executed. To be more specific, the metal bumps 94 are heated and melted in a state in which the metal bumps 94 and the pads 93 (opposing portions) that face the metal pads 94 are in contact with each other.

Figure 27:
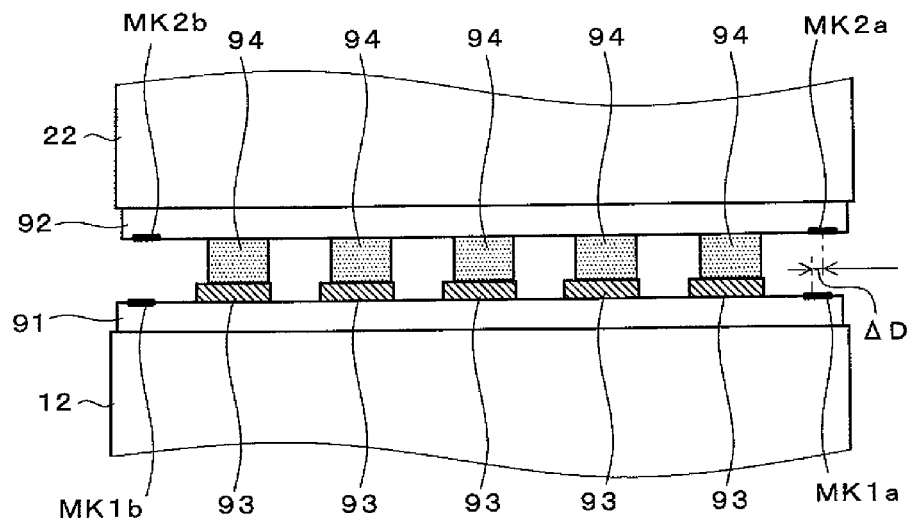
FIG. 27 is a diagram showing a state in which there is a positional shift.

Thereafter, in step S36, a positional shift measurement is performed in the contact state of the objects to be bonded 91 and 92 and in the heat-melt state of the metal bumps 94. As shown in FIG. 27, if there is a positional shift amount ΔD that does not fall within the first tolerance RG1 in the duration of the fixed temperature stage, the procedure proceeds to step S39 via steps S37 and S38.

Figure 28:
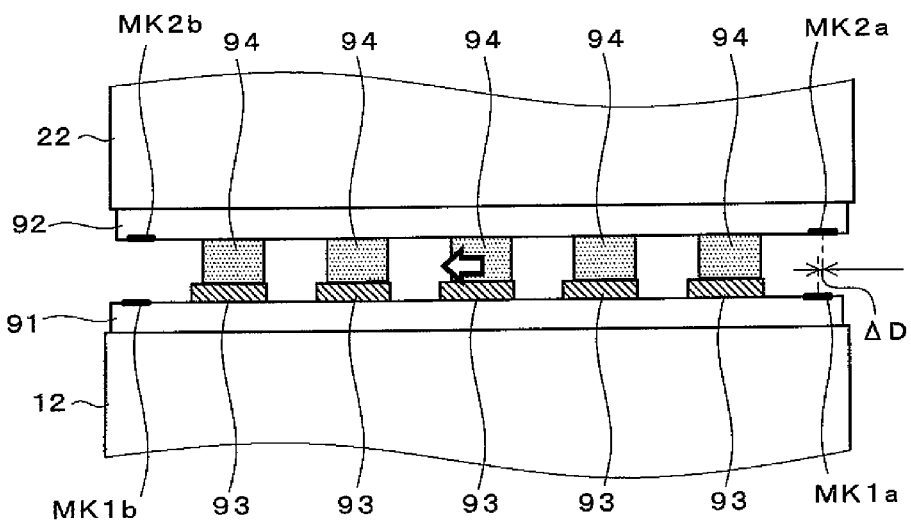
FIG. 28 is a diagram showing a situation in which horizontal positioning of two objects to be bonded is executed in a state in which metal bumps are melted.
Figure 29:
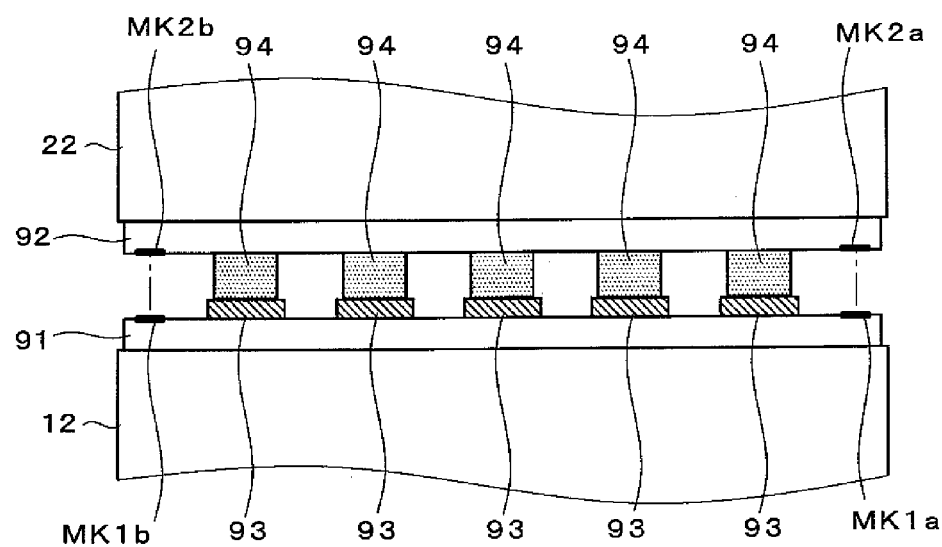
FIG. 29 is a diagram showing a situation in which horizontal positioning of two objects to be bonded is executed in a state in which metal bumps are melted.

In step S39, horizontal positioning of the objects to be bonded 91 and 92 is executed while maintaining the contact state of the objects to be bonded 91 and 92 and the heat-melt state of the metal bumps 94 (see FIG. 28). Specifically, a positioning operation (alignment operation) is executed by moving the head 22 in the horizontal direction (specifically, in the X, Y, and θ directions) so as to correct the positional shift amounts ΔD (Δx, Δy, and Δθ) detected in step S36. FIG. 28 shows a situation in which the head 22 is moved in, for example, the direction indicated by the white arrow. As a result, the positional shift amounts (Δx, Δy, and Δθ) are corrected, and the objects to be bonded 91 and 92 transition to a state in which they have a proper positional relationship (see FIG. 29). In particular, in step S39 in the fourth embodiment, since the metal bumps 94 are in their melt state, it is possible to readily move the objects to be bonded 91 and 92 in the horizontal direction while maintaining the contact between the metal bumps 94 and the pads 93 facing the metal bumps 94.

Thereafter, the procedure returns again to step S36, and the operations from steps S36 to S39 are repeated. In this way, the positional shift measurement operation performed in the contact state and the positional shift correction operation performed while maintaining the contact state are repeatedly executed during the period TM52. To be more specific, these operations are repeatedly performed every several hundred milliseconds (ms), for example. Note that if the positional shift amounts fall within the first tolerances RG1 during the fixed temperature stage TM52, the procedure passes through steps S37 to S41 and returns again to step S36, without executing the processing in step S39.

Then, if it is determined in step S41 that the fixed temperature stage TM52 has ended, the procedure proceeds to step S43. In other words, if it is determined, after the end of the fixed temperature stage TM52, that the positional shift errors fall within the first tolerances RG1, the procedure proceeds to step S43.

In step S43, cooling processing is performed by the cooling unit built in the head 22, as a result of which the metal bumps 94 are cooled and solidified. Then, after the elapse of the cooling period TM53 in FIG. 26, a state in which pressure is applied to the objects to be bonded 91 and 92 is released. With these operations, the objects to be bonded 91 and 92 are favorably aligned with and bonded to each other.

Meanwhile, if the positional shift amounts ΔD do not yet fall within the first tolerances RG1 and the extended period TM55 after the end of the fixed temperature stage has not yet ended (specifically, the upper limit value for the extended period TM55 has not yet elapsed), the processing in step S39 is again executed via steps S37 and S38. In step S39, horizontal positioning of the objects to be bonded 91 and 92 is executed while maintaining the contact state of the objects to be bonded 91 and 92 and the heat-melt state of the metal bumps 94 (see FIG. 28).

Also, if the positional shift amounts ΔD do not yet fall within the first tolerances RG1 even after the extended period TM55 after the end of the fixed temperature stage has ended, the procedure proceeds to step S42 via steps S37 and S38. In step S42, it is determined whether or not the positional shift amounts ΔD fall within the second tolerances RG2.

If the positional shift amounts ΔD fall within the second tolerances RG2, the procedure proceeds to step S43, in which cooling processing is executed.

On the other hand, if the positional shift amounts ΔD are even out of the second tolerances RG2, the procedure proceeds from step S42 to step S44, in which error processing (processing for removing a defective product) is executed.

With the above-described operations, the objects to be bonded 91 and 92 can be aligned with extremely high accuracy because an actual positional shift in the contact state is measured and the alignment operation of correcting such a positional shift is performed as in the first and other embodiments.

Furthermore, the time required for the contact release operation can be shortened because the alignment operation of correcting the positional shift is executed while maintaining the contact state of the objects to be bonded 91 and 92.

Also, in particular, in the alignment operation that accompanies the contact between the metal bumps 94 and the opposing pads 93, a positional shift can generally occur due to the impact force or the like generated at the time of contact between the metal bumps 94 and the opposing pads 93. Also, a positional shift that accompanies a phase change of the metal bumps 94 from the solid phase to the liquid phase can occur when the metal bumps 94 are heated and melted (in particular, at the temperature rise stage).

In contrast, in the fourth embodiment, a positional shift due to the impact force or the like generated at the time of contact between the metal bumps 94 and the opposing pads 93 is favorably corrected, because an actual positional shift is measured after the metal bumps 94 and the opposing pads 93 have come in contact with each other, and the alignment operation of correcting that positional shift is executed.

Furthermore, it is also possible to favorably correct even a positional shift that accompanies a phase change of the metal bumps 94 from the solid phase to the liquid phase, because an actual position after the metal bumps 94 have been heated and melted is measured and the alignment operation of correcting that positional shift is executed. In particular, in the above-described embodiment, a positional shift is measured after a predetermined period has elapsed since the start of heating the metal bumps 94 (specifically, after the end of the temperature rise stage). It is thus possible to favorably correct such a positional shift that may occur noticeably at the initial stage (temperature rise stage) immediately after the start of melting.

Note that the fourth embodiment illustrates the case in which the procedure proceeds to step S43 after waiting for the end of the fixed temperature stage TM52 in step S41, but the present invention is not limited thereto. If the positional shift amounts ΔD fall within the first tolerances RG1, the procedure may proceed immediately to step S43 (cooling processing) without waiting for the elapse of a predetermined period (e.g., five seconds) of the fixed temperature stage TM52.

Furthermore, although the two tolerances RG1 and RG2 are defined in the present example, the present invention is not limited thereto. For example, if the positional shift amounts ΔD are out of predetermined tolerances RG1 even after the fixed temperature period TM52 has elapsed, error processing or the like may be executed immediately.

Furthermore, although the case of providing the extended period TM55 is illustrated here, the present invention is not limited thereto. For example, if the end of the fixed temperature stage is determined in step S38 (FIG. 25), the procedure may proceed to step S42 without providing the extended period TM55 (in other words, by setting the extended period TM55 to zero (seconds)).

5. Fifth Embodiment 5-1. Overview

Although the above-described embodiments illustrate the technique for bonding (applying pressure to) objects to be bonded (objects to be pressurized) in a state in which two portions, which are in the solid phase state prior to their contact, are in contact with each other, the present invention is not limited thereto. In this fifth embodiment, a technique for applying pressure to two objects to be pressurized in a state in which a resin layer that is in a liquid phase state, prior to contact is sandwiched between the objects is illustrated. To be more specific, the case is illustrated in which the idea of the present invention is applied to so-called nanoimprint technology.

Although in the above-described second embodiment, the case is illustrated in which the parallelism of the objects to be bonded 91 and 92 is adjusted based on the relationship between the positional shift amount DD and the displacement ΔZ, the fifth embodiment illustrates a technique for adjusting the parallelism of two objects to be pressurized 81 and 82 based on measured values obtained by multiple distance-measuring sensors.

Figure 30:
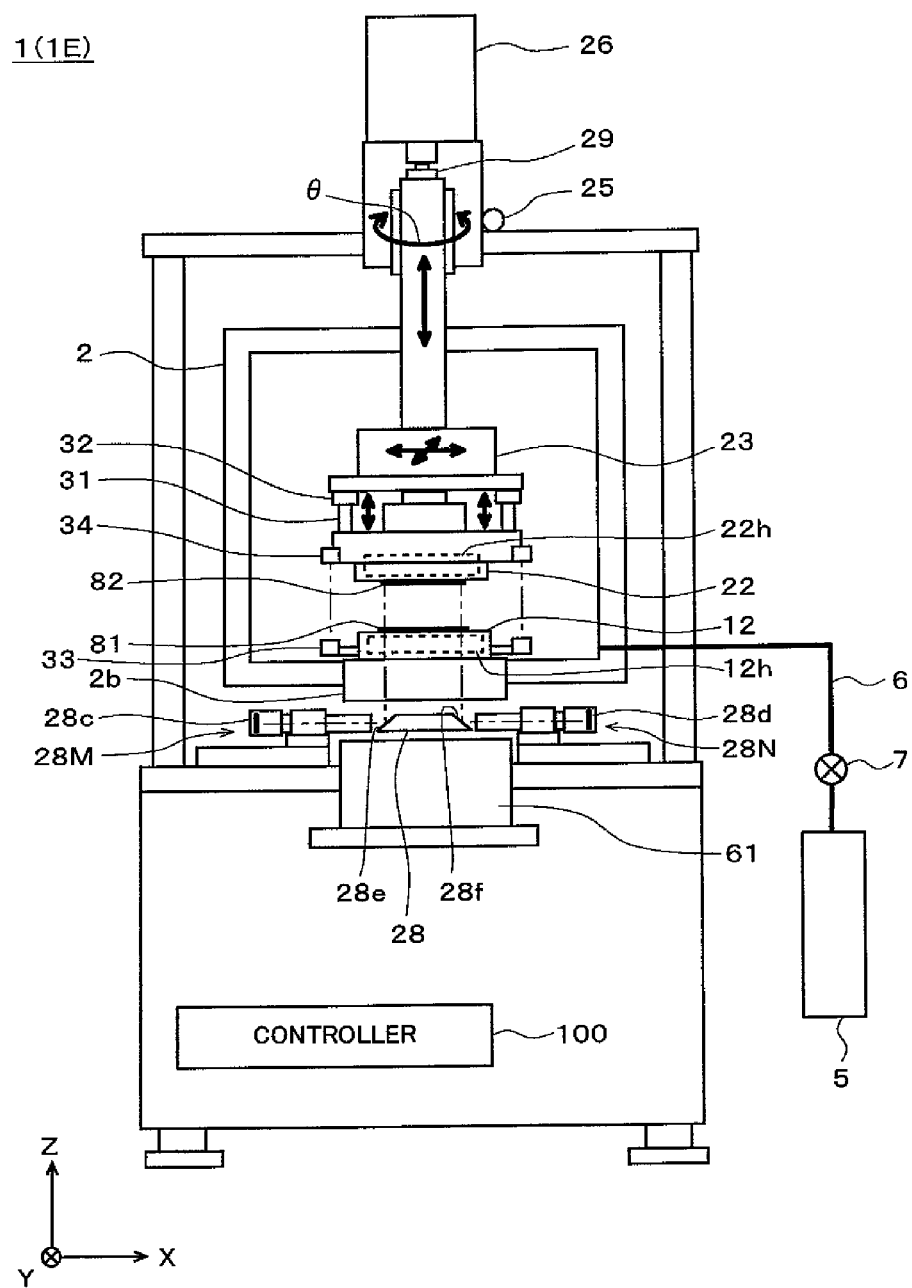
FIG. 30 is a diagram showing a pressure application apparatus according to a fifth embodiment.

FIG. 30 is a diagram showing a pressure application apparatus 1 (also referred to as "1E") according to the fifth embodiment of the present invention. As shown in FIG. 30, the pressure application apparatus 1E has a similar configuration to that of the bonding apparatus (pressure application apparatus) 1A according to the first embodiment. The following description focuses on differences from the apparatus 1A.

As can be seen from the comparison between FIG. 30 and FIG. 1, the apparatus 1E differs from the apparatus 1A in that a UV (ultraviolet ray) irradiation unit 61 is included. Also, the apparatus 1E is configured to allow a mirror fixing member 28g to be movable and retractable in the Y axis direction at the time of UV irradiation. The mirror fixing member 28g is a member that fixes mirrors 28e and 28f. Note that this pressure application apparatus 1E is also referred to as a "nanoimprint apparatus".

Figure 34:
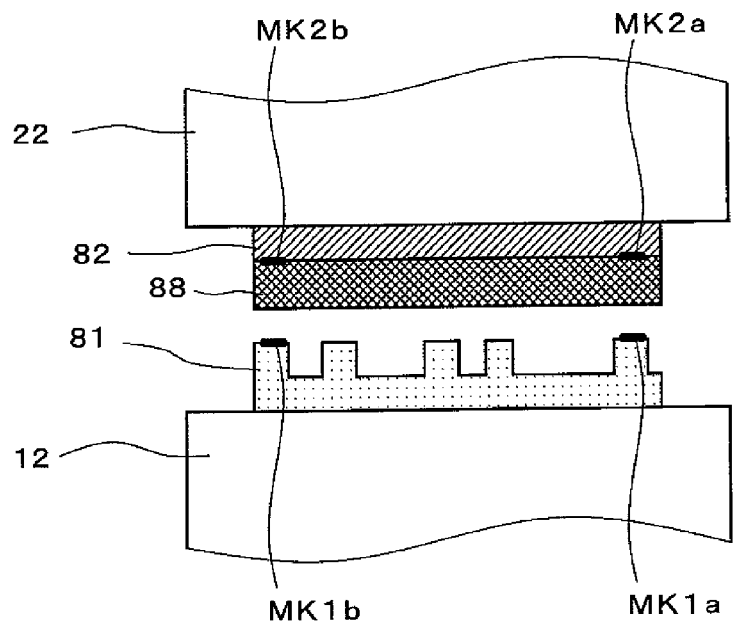
FIG. 34 is a diagram showing a situation in which two objects to be pressurized are correctly disposed (in a non-contact state).

Here, a case is illustrated in which a semiconductor wafer serving as one object to be pressurized 82 is held by the head 22, and a mold (original plate) serving as the other object to be pressurized 81 is held on the stage 12 (see FIG. 34). Also, a photo-curing resin has been applied in advance on the surface (lower surface) of the object to be pressurized 82. In other words, a resin layer 88 formed of a photo-curing resin is provided on the underside of the object to be pressurized 82. Furthermore, the mold 81 is formed of a translucent member (such as quartz), and an uneven pattern is provided on the surface of the mold 81 (on the upper side in the figure). In short, the mold 81 is a transparent mold.

Figure 36:
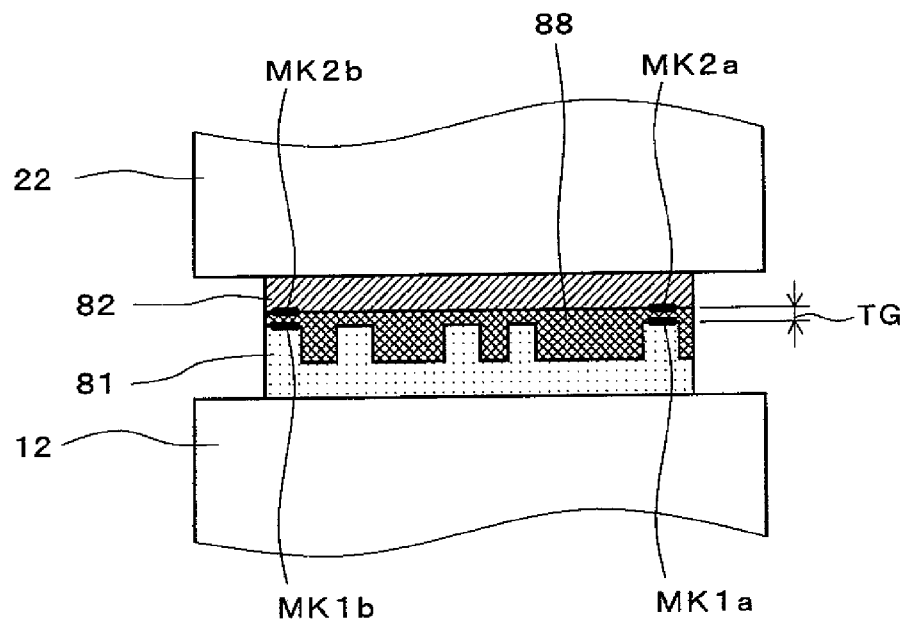
FIG. 36 is a diagram showing a situation in which two objects to be pressurized are correctly disposed (in a contact state).

Then, pressure is applied to the objects to be pressurized 81 and 82 in a state in which the resin layer 88 having fluidity is sandwiched between the objects to be pressurized 81 and 82 (see FIG. 36). To be more specific, pressure is applied in a state in which the object to be pressurized 81, the resin layer 88, and the object to be pressurized 82 are laminated one above the other in the order specified. In other words, pressure is applied to the objects to be pressurized 82 and 81 with the resin layer 88 of a photo-curing resin sandwiched between the objects. By pressing the uneven pattern of the mold 81 against the resin material of the resin layer 88 in this way, the uneven pattern is transferred to the resin layer 88. In nanoimprint technology, a predetermined pattern is formed on the object to be pressurized 82 on this principle.

The fifth embodiment describes a technique for measuring a positional shift between the objects to be pressurized 81 and 82 in a state in which the mold 81 and the resin layer 88 (formed by being applied to the object to be pressurized 82) are in contact with each other, and correcting that positional shift. The resin layer 88 is configured by a substance that has fluidity (is fluidizable) during at least part of a period of applying pressure (in the present invention, also referred to as a "fluid substance" or "fluidizable substance"). The resin layer 88 is also referred to as a "fluidizable substance layer".

Figure 31:
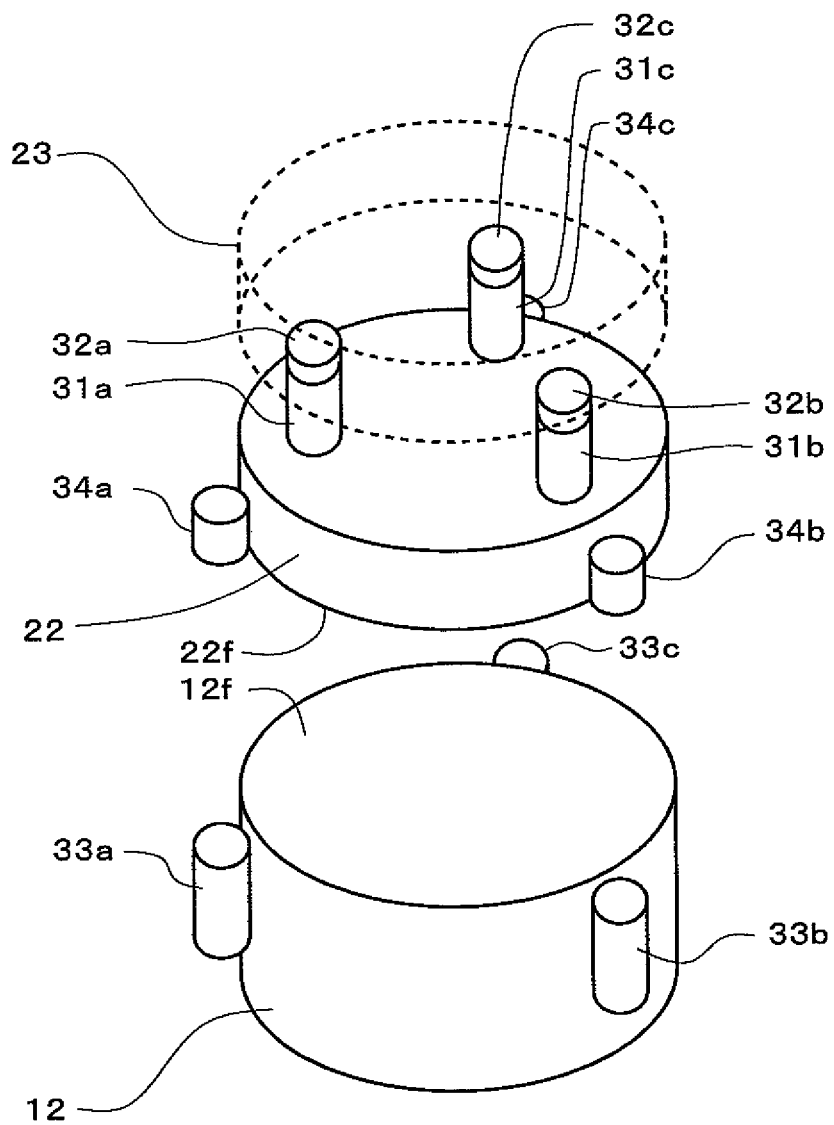
FIG. 31 is a schematic perspective view showing the vicinity of a stage and a head.

FIG. 31 is a schematic perspective view showing the vicinity of the stage 12 and the head 22 in the pressure application apparatus 1E.

As can be seen from the comparison between FIG. 31 and FIG. 3, the pressure application apparatus 1E further includes three distance-measuring sensors 33 (33a, 33b, and 33c) and three reflection plates 34 (34a, 34b, and 34c), in addition to the three piezoelectric actuators 31 (31a, 31b, and 31c) and the three pressure detection sensors 32 (32a, 32b, and 32c).

Figure 32:
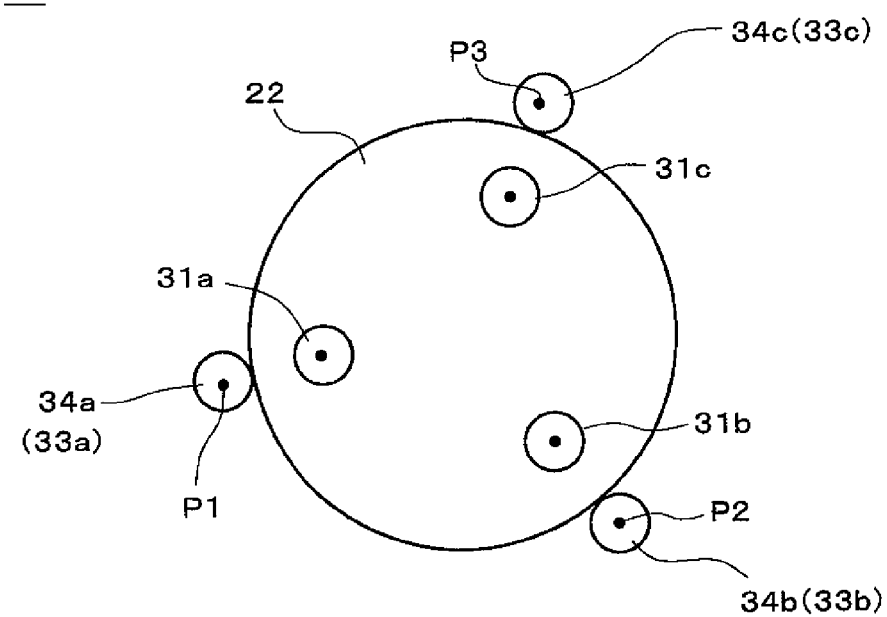
FIG. 32 is a plan view showing the vicinity of the head.

The three distance-measuring sensors 33a, 33b, and 33c are disposed at different positions P1, P2, and P3 that are not on the identical straight line in a plane parallel to the upper surface 12f of the stage 12 (a plane parallel to the XY plane) (see the plan view in FIG. 32). More specifically, the three distance-measuring sensors 33a, 33b, and 33c are fixed at approximately equal intervals on the outer peripheral side surface portion of the generally cylindrical stage 12 (see FIG. 31). Also, the reflection plates 34a, 34b, and 34c are fixedly provided at opposing positions corresponding respectively to the distance-measuring sensors 33a, 33b, and 33c on the outer peripheral side surface portion of the head 22.

For example, laser distance-measuring sensors can be used as the distance-measuring sensors 33a, 33b, and 33c. The distance-measuring sensors (e.g., laser distance-measuring sensors) 33a, 33b, and 33c fixed to the stage 12 measure respective distances to the corresponding reflection plates

34a, 34b, and 34c. Specifically, each distance-measuring sensor 33 emits laser light and measures a distance (distance between positions PZ1 and PZ2) DM from the distance-measuring sensor 33 to the corresponding reflection plate 34, using the laser light (reflected light) reflected on the reflection plate 34 (see FIG. 38). More specifically, each of the distance-measuring sensors 33a, 33b, and 33c measures the distance DM (DM1, DM2, or DM3) in the Z direction between the Z-direction position PZ1 and the Z-direction position PZ2, at each of the positions P1, P2, and P3 in the plane parallel to the XY plane. Note that the Z-direction position PZ1 is a reference position in the Z direction of the distance-measuring sensor 33 fixed to the stage 12, and the Z-direction position PZ2 is a reference position in the Z direction of the reflection plate 34 fixed to the head 22 (see FIG. 38).

With this, it is possible to measure a spacing distance DA (see FIG. 38) in the Z direction between the objects to be pressurized 81 and 82. An operation of applying pressure involving such a measurement operation will be discussed later. Note that, since the three distance-measuring sensors 33a, 33b, and 33c measure the Z-direction distances DA at the three positions P1, P2, and P3 as described above, it is possible to very accurately measure the Z-direction position (relative position) and posture (relative posture) of the head 22 with respect to the stage 12. In other words, the relative positions and relative postures of the objects to be pressurized 81 and 82 can be measured with great accuracy.

Furthermore, as will be discussed later, the objects to be pressurized 81 and 82 can be held appropriately by, for example, approximating these three positions P1, P2, and P3 to the same target value.

5-2. Operation

Figure 33:
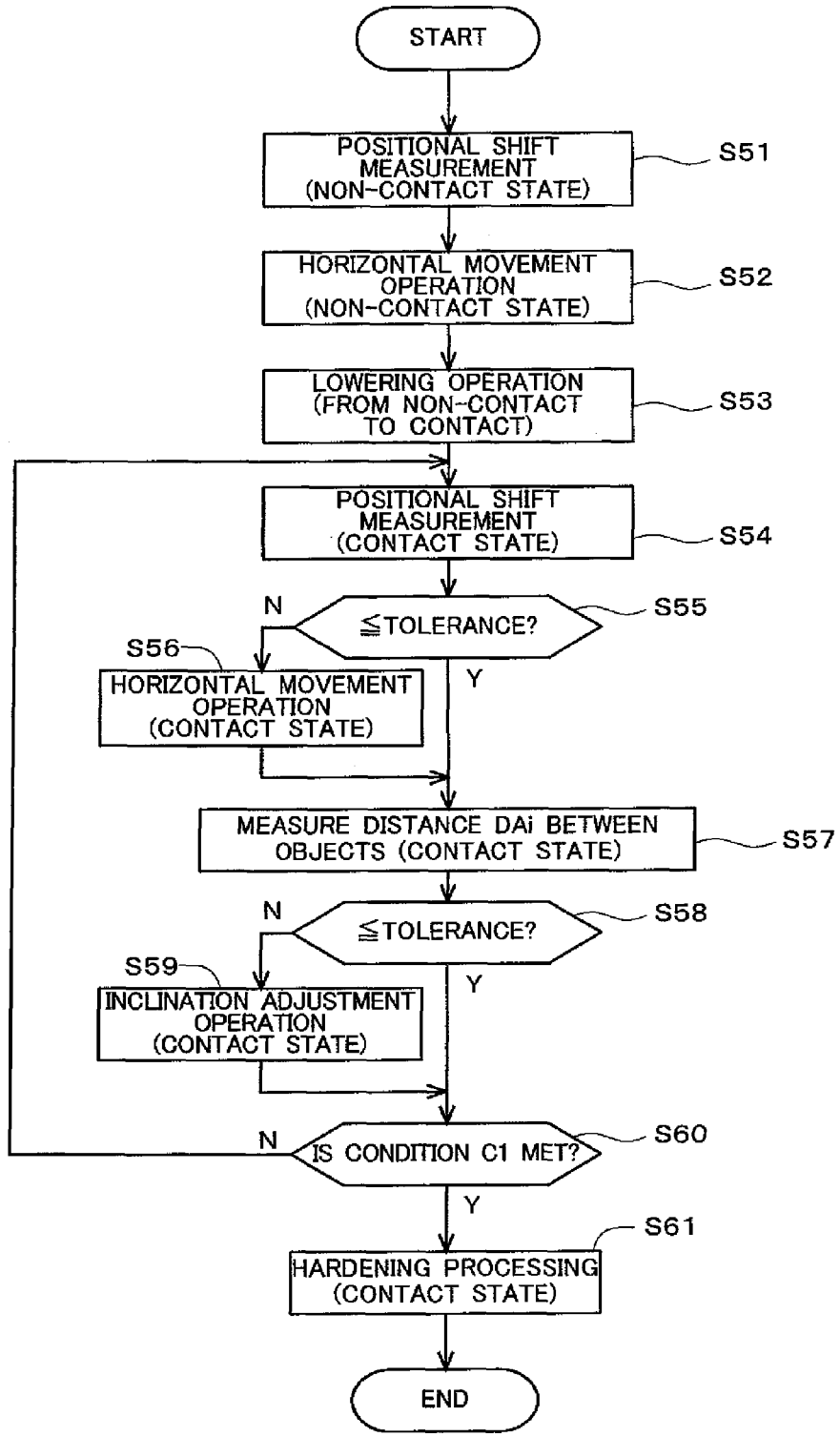
FIG. 33 is a flowchart showing an operation according to the fifth embodiment.

FIG. 33 is a flowchart showing the operation according to the fifth embodiment. The operation of the fifth embodiment will be described below with reference to FIG. 33, focusing on differences from the operation of the third embodiment (FIG. 23). Note that the operations in steps S51 to S55 and S56 are respectively similar to those in steps S11 to S15 and S27.

Firstly, as shown in FIG. 34, the objects to be pressurized 81 and 82 are horizontally aligned with extremely high accuracy by the operations in steps S51 and S52. Note that the objects to be pressurized 81 and 82 are spaced from each other in the vertical direction, and the object to be pressurized 81 and the resin layer 88 adhering to the object to be pressurized 82 have not yet been in contact with each other. Here, the resin layer 88 has been in a liquid phase state from the beginning and already has fluidity prior to the operation of contacting the object to be bonded 81 by lowering the head 22 (step S53).

Figure 35:
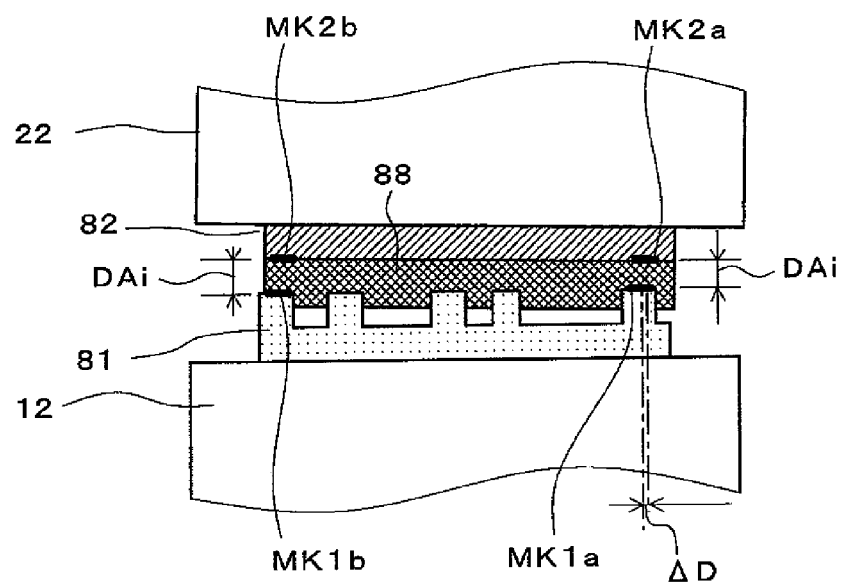
FIG. 35 is a diagram showing a situation in which two objects to be pressurized are brought into contact with each other while accompanying a positional shift therebetween.

Thereafter, in step S53, the head 22 is lowered by driving the Z-axis up-down drive mechanism 26, so that the object to be pressurized 81 and the resin layer 88 of the object to be pressurized 82 are brought into contact with each other (see FIG. 35).

A positional shift similar to that in the above-described first embodiment can occur even immediately after the contact between the object to be pressurized 81 and the resin layer 88. Specifically, immediately after the contact between the object to be pressurized 81 and the resin layer 88, the objects to be pressurized 81 and 82 are often shifted by a slight amount (ΔD) (in particular, in the horizontal direction) from their proper positions due to a physical impact force or the like generated at the time of the contact as shown in FIG. 35.

Also in the present embodiment, with the intention of resolving a positional shift due to contact as mentioned above, the pressure application apparatus 1 measures a positional shift in the horizontal position between the objects to be pressurized 81 and 82 in a state after the object to be pressurized 81 and the object to be pressurized 82 are brought into contact with each other (specifically, in a state after the object to be pressurized 81 and the resin layer 88 of the object to be pressurized 82 are brought into contact with each other). Then, the pressure application apparatus 1 performs positioning of the objects to be pressurized, by correcting that positional shift. With such an operation, it is possible to apply pressure to the objects to be pressurized 81 and 82 in a state in which the objects to be pressurized 81 and 82 are more accurately positioned relative to each other in the horizontal direction. In particular, in the present embodiment, a case is illustrated in which positioning of the objects to be pressurized 81 and 82 is performed by correcting a horizontal positional shift while maintaining the contact state of the object to be pressurized 81 and the resin layer 88.

Specifically, firstly, captured images GAa and GAb (see FIG. 6) of the objects to be pressurized 81 and 82 in the "contact state" (FIG. 35) are acquired in step S54. Then, positional shift amounts (Δx, Δy, and Δθ) in the X, Y, and θ directions between the objects to be pressurized 81 and 82 are measured based on the two captured images GA and GAb.

Thereafter, if it is determined in step S55 that the positional shift amounts fall within tolerances, the procedure proceeds to step S57. On the other hand, if it is determined that the positional shift amounts are out of the tolerances, the procedure proceeds to step S56.

In step S56, horizontal positioning of the objects to be pressurized 81 and 82 is executed while maintain the contact state (pressure contact state) of the objects to be pressurized 81 and 82. Specifically, a positioning operation (alignment operation) is performed by moving the head 22 in the horizontal direction (specifically, in the X, Y, and θ directions) so as to correct the positional shift amounts (Δx, Δy, and Δθ) detected in step S54. As a result, the positional shift amounts (Δx, Δy, and Δθ) are corrected. Thereafter, the procedure proceeds to step S57.

In steps S57 to S59, a parallelism adjustment operation (also referred to as a "posture adjustment operation" or "inclination adjustment operation") is also executed. Specifically, distances DMi are measured at three different positions P1, P2, and P3, and multiple piezoelectric actuators 31a, 31b, and 31c or the like are driven such that distances DAi between the object to be pressurized 82 and the object to be pressurized 81 (see FIGS. 32 and 35) are equal to their desired values TG (see FIG. 36). This realizes the operation of controlling the distances DA (see FIG. 38) between the objects to be pressurized 81 and 82 to predetermined values while disposing the objects to be pressurized 81 and 82 in parallel with each other.

In step S57, each distance DAi between the objects is measured in the following manner.

Figure 38:
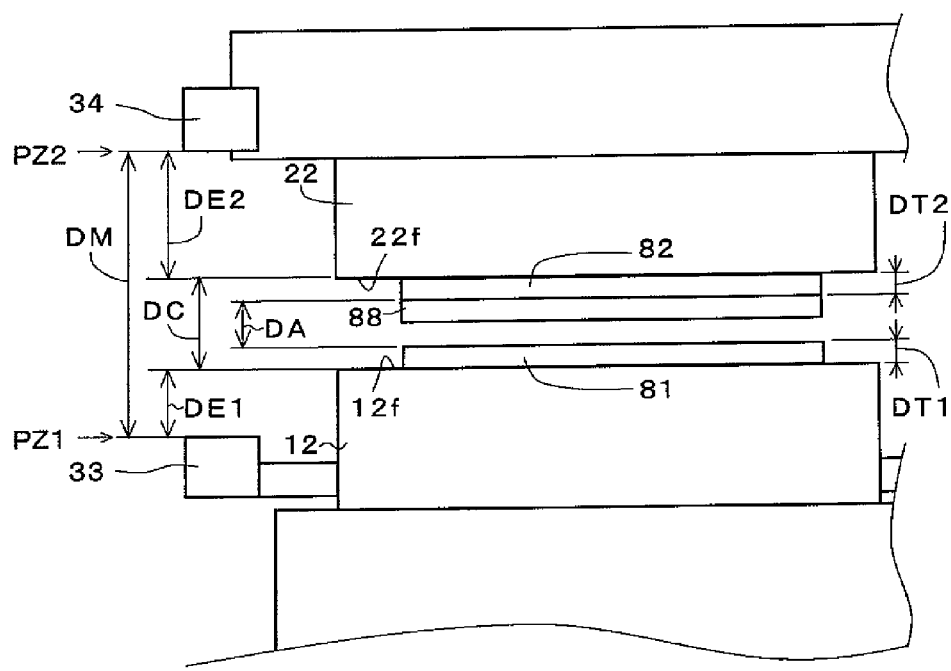
FIG. 38 is a diagram showing the positional relationship between the stage and the head in the vertical direction.

The pressure application apparatus 1E firstly measures the respective distances DM (specifically, DMi (i=1, 2, and 3)) at the three positions P1, P2, and P3 (see FIG. 32), using the three distance-measuring sensors 33a, 33b, and 33c (see FIG. 38).

Next, a controller 100 of the pressure application apparatus 1E calculates the distance DA between the objects to be pressurized 81 and 82, based on the measured distances DM and Equation (1).

[Equation 1]

$$DA = DM - (DE1 + DT1 + DT2 + DE2) \quad (1)$$

Here, as also shown in FIG. 38, a value DE1 represents a displacement in the Z direction (Z-direction distance) between a position PZ1 and a pressure surface 12f of the stage 12 (pressure application member), and a value DE2 represents a displacement in the Z direction (Z-direction distance) between a position PZ2 and a pressure surface 22f of the head 22 (pressure application member). It is assumed that these values DE1 and DE2 are known values measured in advance, and are stored in a storage unit in the controller 100 (FIG. 30) of the pressure application apparatus 1E.

Further, a value DT1 represents the thickness of the object to be pressurized 81 in the Z direction, and a value DT2 represents the thickness of the object to be pressurized 82 in the Z direction. Theses thicknesses DT1 and DT2 of the objects to be pressurized 81 and 82, which have been measured in advance, are also stored in the storage unit in the controller 100.

The controller 100 performs calculation processing according to Equation (1) described above (or Equation (3) described later), based on data regarding the values DE1 and DE2 and data DT1 and DT2 regarding the thicknesses of the objects to be pressurized 81 and 82 targeted for pressure treatment. Using such individual measured data regarding the thicknesses of the objects to be pressurized 81 and 82 targeted for actual processing in this way enables the distance DA between the objects to be obtained with higher accuracy than in the case of using theoretical values for the thicknesses of the objects to be pressurized 81 and 82.

Here, a distance DC between the pressure surface 22f of the head 22 and the pressure surface 12f of the stage 12 is expressed by Equation (2) using the above-described values DE1 and DE2.

[Equation 2]

$$DC = DM - (DE1 + DE2) \quad (2)$$

That is, by using the above-described values DE1 and DE2, measuring the distance DM is equivalent to measuring the distance DC. In other words, measuring the distance DM with the distance-measuring sensors 33 is equivalent to measuring the distance DC with the distance-measuring sensors 33.

Taking Equation (2) into consideration, Equation (1) above can also be expressed by Equation (3).

[Equation 3]

$$DA = DC - (DT1 + DT2) \quad (3)$$

That is, the distance DA between the objects to be pressurized 81 and 82 at a position Pi is calculated using the value DC and the values DT1 and DT2.

By using Equation (1) or Equation (3), the value DA is calculated based on the measured distance value DM (or DC) and the thicknesses DT1 and DT2 of the two objects to be pressurized 81 and 82. In short, the distance-measuring sensors 33 are capable of measuring the distance DA by measuring the distance DM (or DC).

In step S57, the distances DAi between the objects at three positions Pi are calculated by performing the above-described calculation processing on the distances DMi measured at the three positions Pi. To be more specific, the distances DAi at the three positions Pi are measured based on the measured distances DMi, the values DT1 and DT2, and the values DE1 and DE2.

Thereafter, whether or not errors ΔEi(=TG·DAi) of the respective distances DAi between the objects with respect to the target value TG fall within tolerances is determined in step S58. If it is determined that the errors ΔEi fall within the tolerances, the procedure proceeds to step S60. On the other hand, if it is determined that any of the errors ΔEi does not fall within the tolerance, the procedure proceeds to step S59.

In step S59, the relative postures of the objects to be pressurized 81 and 82 are corrected while maintaining the contact state (pressure contact state) of the objects to be pressurized 81 and 82. Specifically, the three piezoelectric actuators 31a, 31b, and 31c are driven such that the respective distances DAi approach their target values TG. Thereafter, the procedure proceeds to step S60.

In determination processing performed in the next step S60, it is determined whether or not a condition C1 for the immediately preceding measurement results (Δx, Δy, Δθ, and ΔEi) is met. This condition C1 is that all of the positional shift amounts (Δx, Δy, and Δθ) in the XY plane between the objects to be pressurized 82 and 81 fall within tolerances and all of the errors ΔEi of the distances DAi between the objects with respect to the target values TG fall within tolerances.

Then, if it is determined that the above-described condition C1 is not met, the procedure returns again to step S54, where similar operations are repeated. On the other hand, if it is determined that the above-described condition C1 is met, the procedure proceeds to step S61.

If the positional shift measurement operation (step S54) and the operation of measuring the distances DAi between the objects (step S57) each have been performed at least once and the condition C1 is met, it indicates that the positional shift amounts (Δx, Δy, and Δθ) in the XY plane are very small and the object to be pressurized 82 and 81 are disposed in parallel with each other, as shown in FIG. 36. That is, the objects to be pressurized 81 and 82 are disposed with great accuracy.

Figure 37:
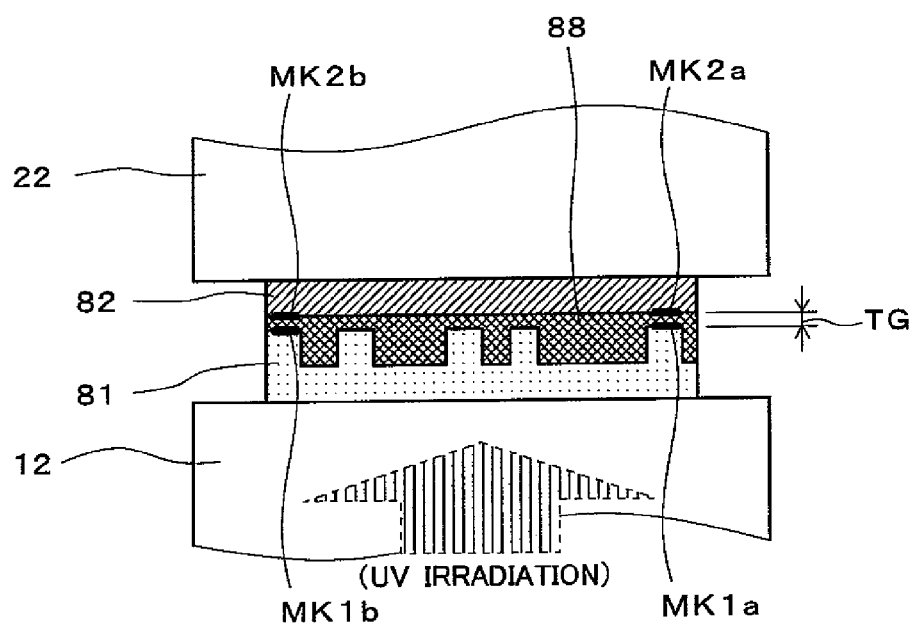
FIG. 37 is a diagram showing a situation in which ultraviolet-ray irradiation processing is performed.

In step S61, the UV irradiation unit 61 apply ultraviolet (UV) rays in a state in which the objects to be pressurized 81 and 82 are disposed with great accuracy (see FIG. 37). The applied ultraviolet rays are transmitted through the translucent mold 81 and reach the resin layer 88. Accordingly, the photo-curing resin of the resin layer 88 that had fluidity just before the UV irradiation is hardened. As a result, the resin layer 88 with a predetermined uneven pattern is formed on the surface of the object to be pressurized 82, in a state in which the resin layer has the desired residual TG and is hardened.

Through the above-described processes, various types of devices (e.g., semiconductor devices or MEMS (micro electro mechanical systems) devices) are manufactured with extremely high precision, using nanoimprint technology.

In such an example, a horizontal positional shift due to the contact operation itself between the objects to be pressurized 81 and 82 is reduced by the horizontal position adjustment operation in steps S54 to S56 or the like. Accordingly, the objects to be pressurized 81 and 82 are horizontally aligned with extremely high accuracy in the final post-contact state (at the time of hardening or the like).

Furthermore, the respective distances DAi between the objects are accurately controlled based on the values measured by the distance-measuring sensors 33a, 33b, and 33c in the inclination adjustment operation in steps S57 to S59. Accordingly, it is possible to control the thickness (residual) DA of the resin layer 88 to the desired value TG while disposing the semiconductor wafer 82 and the mold 81 in parallel with each other. In particular, even if the resin layer sandwiched between the objects to be pressurized has fluidity, it is possible to dispose the objects to be pressurized 81 and 82 in proper postures (e.g., in parallel) relative to each other, as well as to more accurately control the distance between the objects to be pressurized.

Furthermore, in particular, according to the above-described example, the resin layer is hardened in a state in which both of the horizontal (X-direction, Y-direction, and θ-direction) positioning and the positioning of the distances DAi between the objects (which is also referred to as "vertical (Z-direction) positioning" or "inclination adjustment operation") have been performed. Accordingly, it is possible to generate a three-dimensional molded component that has been positioned with high accuracy in both the horizontal and vertical directions.

Note that in the above-described fifth embodiment, the case is illustrated in which the inclination adjustment operation (steps S57, S58, and S59) is performed only after the contact between the resin layer 88 and the mold 81, but the present invention is not limited thereto. For example, the inclination between the objects to be pressurized 82 and 81 may be adjusted in advance prior to the contact between the resin layer 88 and the mold 81. Specifically, an inclination adjustment operation (similar to that in steps S57, S58, and S59) may be executed in the non-contact state between steps S52 and S53. Note that the target values for the distances DAi between the objects at this time are preferably values TF (>TG) greater than the above-described values TG so that the resin layer 88 and the mold 81 will not yet be brought into contact with each other.

Furthermore, in the fifth embodiment, in obtaining each of the three distances DAi at each position Pi, the same values DT1 and DT2 and the same values DE1 and DE2 are used, but the present invention is not limited thereto. For example, different values measured in a portion in the vicinity of each position Pi may be used for the values DT1 and DT2 and the values DE1 and DE2 in obtaining the distance at that position Pi.

Furthermore, although the fifth embodiment illustrates the case in which an upper object to be pressurized and a lower object to be pressurized are disposed in parallel with each other, the present invention is not limited thereto. For example, the relative positional relationship between the upper object to be pressurized and the lower object to be pressurized may be adjusted such that the three distances DAi between the objects at the three positions P1, P2, and P3 reach (converge on) different target values.

Furthermore, although the above-described fifth embodiment illustrates the case in which the above-described idea is applied to nanoimprint technology using a mold, the present invention is not limited thereto. For example, the above-described idea may be applied to the case where pressure is applied to two substrates with a resin layer sandwiched therebetween (see FIGS. 41 and 44 or the like, which will be discussed later). In particular, a portion that has a liquid phase state, prior to contact may be used as a resin layer in a manner similar to the fifth embodiment, and the above-described idea may be applied to a technique for applying pressure to two substrates with that resin layer sandwiched therebetween.

7. Other Embodiments

While the above has been a description of embodiments of the present invention, the present invention is not intended to be limited to the above-described content.

Figure 39:
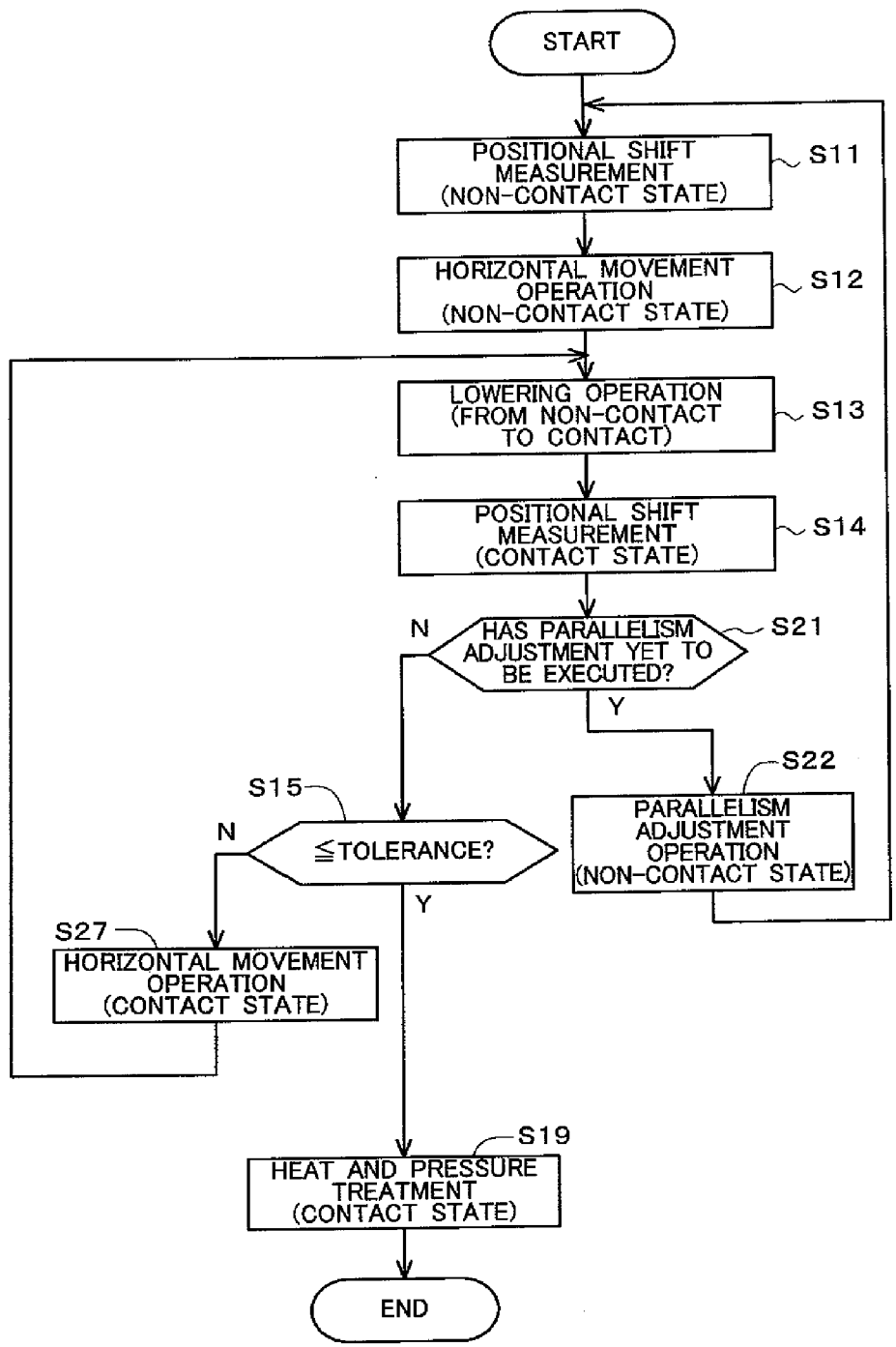
FIG. 39 is a flowchart showing an operation according to a variation.

For example, an operation that combines the above-described second embodiment and the above-described third embodiment may be executed as shown in FIG. 39. FIG. 39 illustrates an example in which step S27 (FIG. 23) is executed, instead of steps S16 and S17 in FIG. 18.

Likewise, an operation that combines the above-described second embodiment and the above-described fourth embodiment may be executed. Specifically, the parallelism adjustment operation or the like (see steps S14 and S22 in FIG. 18) may be executed prior to the start of the heat treatment (step S34) in FIG. 25 (in other words, prior to the melting of the metal bumps 94).

Furthermore, although the above-described first to fourth embodiments illustrate the case in which surface activation processing is performed in advance on the bonding surfaces of the objects to be bonded 91 and 92 outside the above-described bonding apparatus 1, the present invention is not limited thereto. For example, surface activation processing may be performed in advance inside the bonding apparatus 1.

Figure 40:
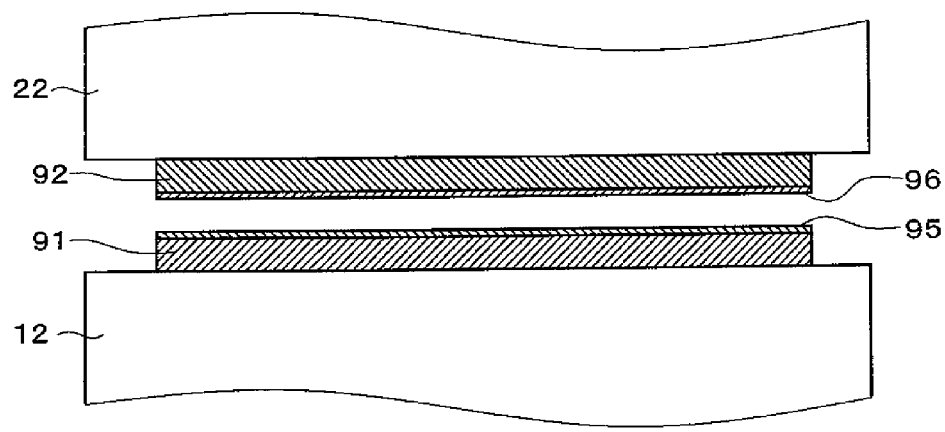
FIG. 40 is a diagram showing two objects to be pressurized according to another variation.
Figure 41:
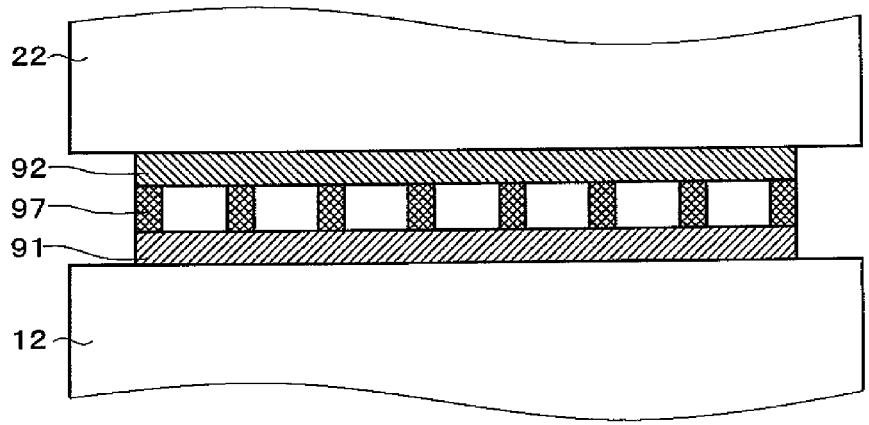
FIG. 41 is a diagram showing two objects to be pressurized according to still another variation.

Furthermore, although the above-described first to fourth embodiments illustrate a combination of a chip and a substrate as an example of the objects to be bonded 91 and 92, the present invention is not limited thereto. For example, the above-described idea is also applicable to bonding (bonding under pressure) of semiconductor wafers (silicon (Si) substrates). Specifically, the above-described idea is also applicable to the case of, as shown in FIG. 40, bonding semiconductor wafers 91 and 92 in which thin films 95 and 96 made of gold (Au) are respectively formed on the bonding surface sides of the semiconductor wafers 91 and 92. Alternatively, the above-described idea is applicable to the case of, as shown in FIG. 41, bonding a semiconductor wafer 92 and a resin layer 97 on the semiconductor wafer 91, the resin layer 97 having been provided in part on the semiconductor wafer 91 (specifically, the bonding surface thereof). As the resin layer 97, a thermosetting resin or a light curable resin can be used, for example. To be more specific, a horizontal positional shift is measured in a state in which both of the semiconductor wafers 91 and 92 are in contact with each other at a portion corresponding to the resin layer 97. Then, the resin layer 97 may be hardened after the horizontal positional shift is corrected and the semiconductor wafers 91 and 92 are bonded together. This enables the resin layer 97 to be precisely positioned in the horizontal direction and to be sealed, for example. Note that the operation of correcting a horizontal positional shift is preferably performed while maintaining the contact state of the semiconductor wafer 92 and the resin layer 97 that has fluidity. Alternatively, the resin layer may be provided on both of the bonding surfaces of the semiconductor wafers 91 and 92. Alternatively again, such a resin layer may be provided over the entire surface of at least one of the objects to be bonded 91 and 92. Furthermore, the above-described idea is also applicable to a technique for applying pressure with a resin layer sandwiched not only between the semiconductor wafers but also between various types of members.

Furthermore, although the above-described fifth embodiment illustrates the case in which the inclination adjustment operation by the distance-measuring sensors 33 or the like is applied to the technique for bonding (applying pressure to) two portions that include a portion being in a liquid phase state prior to their contact, by bringing these portions into contact with each other, the present invention is not limited thereto. For example, the inclination adjustment operation (the parallelism adjustment operation or the like) by the distance-measuring sensors 33 or the like is also applicable to the technique (first to fourth embodiments or the like) for bonding (applying pressure to) two portions that have a solid phase state prior to their contact, by bringing these portions into contact with each other.

Furthermore, although the above-described fifth embodiment illustrates the case in which a light-curable resin material is used as a fluidizable substance, the present invention is not limited thereto. It is sufficient that the "fluidizable substance" is a substance having fluidity during at least part of the period of applying pressure, and may, for example, be a thermosetting resin material or a metal such as solder. A configuration is also possible in which a post-contact positional shift between the "fluidizable substance" and an object to be pressurized is corrected. Furthermore, the fluidizable substance may be a substrate that already has fluidity prior to contact (e.g., a light-curable resin material in the fifth embodiment), or may be a substrate that does not have fluidity prior to contact and will have fluidity after contact (e.g., the metal bumps in the fourth embodiment).

The technique according to the aforementioned fifth embodiment or the like is also applicable to a lens molding technique, for example.

Figure 42:
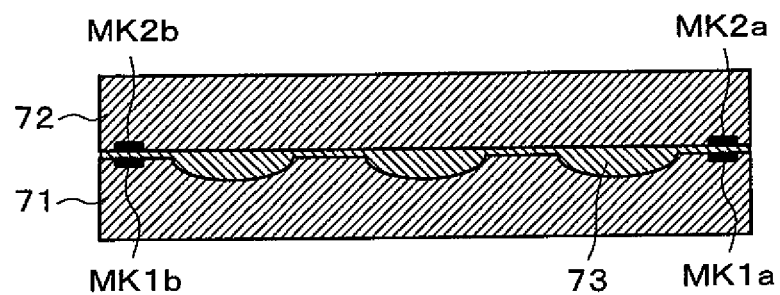
FIG. 42 is a diagram showing two objects to be pressurized according to another variation.

For example, as shown in FIG. 42, the above-described idea is applicable to the case in which multiple lenses are formed on one surface of a substrate (e.g., glass substrate) 72 by molding and hardening a resin layer 73 on that surface of the substrate 72, using a mold 71 that has multiple concave portions formed in accordance with the respective lens shapes. In particular, using the above-described horizontal alignment technique enables each lens to be accurately disposed at a predetermined position in the substrate. Furthermore, it is also possible to accurately control the thickness of each lens by accurately controlling a vertical distance using distance-measuring sensors or the like as in the above-described fifth embodiment.

Figure 43:
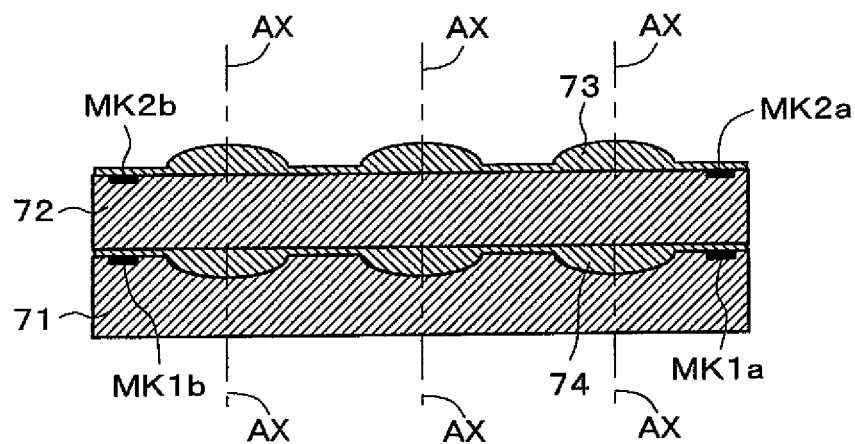
FIG. 43 is a diagram showing two objects to be pressurized according to another variation.

Furthermore, lens may be formed on both front and rear surfaces of the substrate 72 with the application of the above-described idea (see FIG. 43). Specifically, as shown in FIG. 43, it is possible to form multiple lens on the other surface of the substrate (e.g., glass substrate) 72 by molding and hardening a resin layer 74 on the other surface of the substrate 72, using the above-described mold 71. In this case, by using the above-described horizontal alignment technique to form lenses on both surfaces, it is possible to accurately dispose the lens provided on the upper surface side of the substrate (also referred to "upper lenses") and the lens provided on the lower surface side of the substrate (also referred to as "lower lens") at predetermined positions in the substrate. In particular, it is also possible to accurately align the horizontal positions of the optical axes AX of the upper lenses and the horizontal positions of the optical axes AX of the lower lenses.

Figure 44:
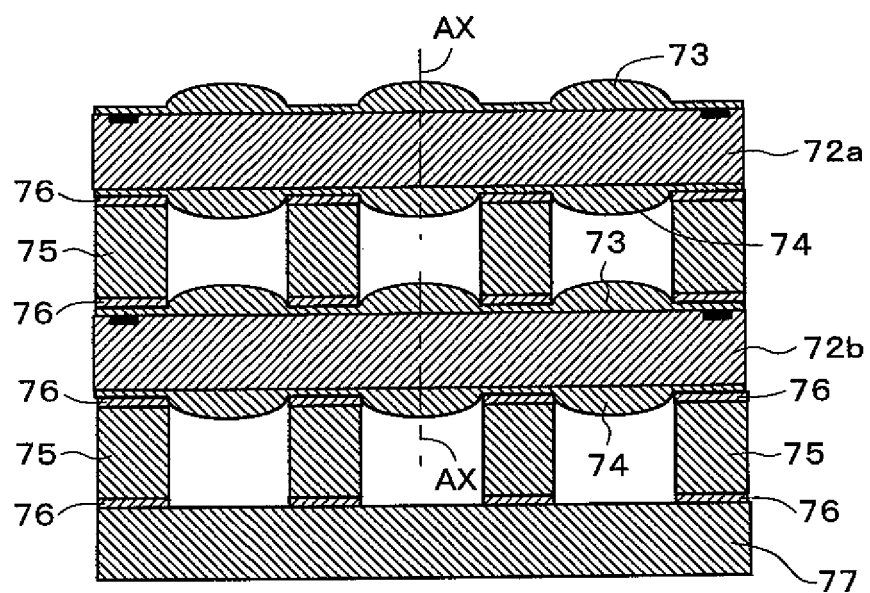
FIG. 44 is a diagram showing two objects to be pressurized according to another variation.

Furthermore, the above-described idea is also applicable to the case where, as shown in FIG. 44, multiple substrates 72 (72a, 72b) and 77 formed as mentioned above (see FIG. 43) are laminated one above another in the direction of the optical axes of the lenses via a spacer 75 and a resin layer 76. This makes it possible to minimize shifts in optical axes between lenses in a given substrate and lenses in another substrate (e.g., shifts between the optical axes AX of the lenses in the upper substrate 72a and the optical axes AX of the lenses in the lower substrate 72b). Furthermore, it is also possible to accurately control the distance (e.g., a focal length) in the optical axis direction between multiple lenses disposed in the vertical direction (optical axis direction), by accurately controlling the distances between the multiple substrates (e.g., the distance between the substrates 72a and 72b and the distance between the substrates 72b and 77).

Using such a technique enables generation of micro-machined components including lenses. In particular, hardening can be performed after two types of positioning (horizontal positioning and vertical positioning), namely, horizontal positioning (in the X, Y, and θ directions) and positioning of the distances DAi between the objects (also referred to as "vertical positioning" or "posture adjustment operation") have been performed. Accordingly, it is possible to generate a three-dimensional molded component that is positioned with high precision in both horizontal and vertical directions. Note here that the idea of the present invention that "pressure is applied to two objects to be pressurized" includes examples in which pressure is applied to three or more objects to be pressurized (including two objects to be pressurized) as shown in FIG. 44.

Furthermore, in the above-described fifth embodiment, the case is illustrated in which the three distances DAi between the objects are measured based on the distances DMi measured by the three distance-measuring sensors 33a, 33b, and 33c, the values DT1 and DT2, and the values DE1 and DE2. In short, the case where the distances DAi between the objects are indirectly measured is illustrated. However, the present invention is not intended to be limited thereto, and a configuration is also possible in which the distances DAi between the objects may be directly measured. For example, a configuration is possible in which, assuming that a first reflecting surface is provided on the surface of a glass mold and a second reflecting surface is provided on the surface of a glass wafer, the distances from distance-measuring sensors provided on the underside of the glass mold to these two reflecting surfaces are measured, and a difference between the two measured distances are calculated as the distances DAi between the objects.

Furthermore, although the above-described embodiments illustrate the case where the cameras 28M and 28N, each serving as an image capturing unit for fine alignment, are disposed at fixed positions, the present invention is not limited thereto, and images in the vicinity of two alignment marks may be captured by moving a single camera.

Furthermore, although the above-described embodiments illustrate the case where the stage 12 is moved in the X direction, the present invention is not limited thereto. For example, the stage 12 may be fixed.

Furthermore, although the above-described embodiments illustrate the case where the head 22 and the stage 12 are moved relative to each other in the X, Y, Z, and θ directions by moving the head 22 in these directions, the present invention is not limited thereto. In contrast, for example, the head 22 may be fixed and the stage 12 may be moved in the X, Y, Z, and θ directions such that the head 22 and the stage 12 are moved relative to each other in these directions.

Furthermore, although the above-described embodiments illustrate the case of movement in the X, Y, and θ directions in step S17, S27, or S56 so as to eliminate the positional shift amounts ΔD (Δx, Δy, and Δθ), the present invention is not limited thereto.

For example, if the measurement results regarding a positional shift fall within predetermined tolerances in step S17, S27, or S56, positioning may be performed by only movement in the X and Y directions (two translational directions parallel to a horizontal plane) without involving movement in the θ direction (the direction of rotation around the axis parallel to the Z axis).

In general, in the case of involving movement in the θ direction, a new positional shift can occur in the translational direction due to that θ-direction movement.

In contrast, according to a variation such as described above, involving only movement in the translational direction at the final stage of positioning makes it possible to prevent the occurrence of such a new positional shift, thus achieving efficient positioning.

Note that whether or not the measurement results regarding a positional shift fall within predetermined tolerances may be determined based on, for example, whether or not the condition that all of the three shift amounts (Δx, Δy, and Δθ) fall within their tolerances is met. However, the condition is not limited thereto, and whether or not the condition that some (e.g., only Δθ) of the three shift amounts (Δx, Δy, and Δθ) fall within tolerances is met may be based on to determine whether or not the measurement results regarding a positional shift fall within predetermined tolerances.

Furthermore, although the above-described embodiments illustrate the case of measuring the three horizontal positional shifts ($\Delta x$, $\Delta y$, and $\Delta \theta$), the present invention is not limited thereto. For example, only the two horizontal shift amounts ($\Delta x$ and $\Delta y$) may be measured. In this case, the image GAa may be acquired using only a single image capturing unit (e.g., 28M), and only positional shifts in the X and Y directions may be measured.

Description of Reference Signs

1 Bonding apparatus
2 Vacuum chamber
12 Stage
22 Head
22$h$ Heater
23 Alignment table
28L, 28M, 28N Image capturing unit (camera)
31$a$, 31$b$, 31$c$ Piezoelectric actuator
91, 92 Object to be bonded
93 Pad
94 Metal bump
95, 96 Thin film
97 Resin layer
GAa, GAb Captured image
MK1$a$, MK1$b$, MK2$a$, MK2$b$ Alignment mark
$\Delta D$, $\Delta x$, $\Delta y$, $\Delta \theta$ Positional shift amount
$\Delta Z$ Z-direction displacement amount

The invention claimed is:

1. A pressure application apparatus that applies pressure to objects to be pressurized including a first object to be pressurized and a second object to be pressurized, comprising:
relative movement means for moving the first object to be pressurized and the second object to be pressurized relative to each other in a predetermined direction;
measurement means for measuring a positional shift between the first object to be pressurized and the second object to be pressurized in a plane perpendicular to the predetermined direction, in a state in which the objects to be pressurized are in contact with each other by the relative movement operation performed by the relative movement means; and
alignment means for performing positioning of the objects to be pressurized, by correcting the positional shift; and
wherein after the measurement means has measured the positional shift, the relative movement means moves the objects to be pressurized relative to each other in the predetermined direction to temporarily release the contact state of the objects to be pressurized;
wherein the alignment means moves the objects to be pressurized relative to each other in a plane perpendicular to the predetermined direction to correct the positional shift in a state in which the contact between the objects to be pressurized has been released; and
wherein after the alignment means has moved the objects to be pressurized relative to each other in the state in which the contact between the objects to be pressurized is released, the relative movement performs a re-contact operation of bringing the objects to be pressurized again into contact with each other.

2. The pressure application apparatus according to claim 1, wherein the measurement means acquires a captured image that includes alignment marks including a first alignment mark added to the first object to be pressurized and a second alignment mark added to the second object to be pressurized, and measures the positional shift between the objects to be pressurized, based on the captured image.

3. The pressure application apparatus according to claim 2, wherein the measurement means measures the positional shift between the objects to be pressurized, by acquiring the captured image in a state in which the alignment marks are spaced from each other in the predetermined direction, and detecting an edge of a portion corresponding to each of the alignment marks in the captured image, using a vector correlation method.

4. The pressure application apparatus according to claim 3, wherein an imaging optical system of the measurement means includes fo cal-position adjustment means for adjusting a position where light from an object forms an image, and the captured image is acquired in a state in which light from a virtual object forms an image on an image capturing plane of an image capturing unit, the virtual object being located at a position between a position of the first alignment mark and a position of the second alignment mark in the predetermined direction.

5. The pressure application apparatus according to claim 1, wherein an operation of the measurement means measuring the positional shift and an operation of the alignment means correcting the positional shift are repeatedly executed.

6. The pressure application apparatus according to claim 1, wherein before the objects to be pressurized are moved relative to each other by the relative movement means and brought into contact with each other, the measurement means measures a first positional shift in a state in which the first object to be pressurized and the second object to be pressurized face each other without contact, the first positional shift being a positional shift between the objects to be pressurized in a plane perpendicular to the predetermined direction;
wherein the alignment means performs positioning of the objects to be pressurized by correcting the first positional shift;
wherein after the first positional shift has been corrected, the relative movement means moves the first object to be pressurized and the second object to be pressurized relative to each other in the predetermined direction to bring the first object to be pressurized and the second object to be pressurized into contact with each other;
wherein the measurement means measures a second positional shift in a state in which the first object to be pressurized and the second object to be pressurized are in contact with each other by the relative movement operation performed by the relative movement means after the correction of the first positional shift, the second positional shift being a positional shift between the objects to be pressurized in a plane perpendicular to the predetermined direction;
wherein the relative movement means moves the objects to be pressurized relative to each other in the predetermined direction after the operation of the measurement means measuring the second positional shift, so that the contact state of the objects to be pressurized is temporarily released;
wherein the alignment means moves the objects to be pressurized relative to each other in a plane perpendicular to the predetermined direction to eliminate the second positional shift in a state in which contact between the objects to be pressurized has been released; and
wherein after the contact state of the objects to be pressurized has been temporarily released and the objects to be pressurized have been moved relative to each other to eliminate the second positional shift, the relative movement means performs a re-contact operation of bringing the objects to be pressurized again into contact with each other.

7. The pressure application apparatus according to claim 6, wherein the relative movement means performs the re-contact operation on the objects to be pressurized that have undergone surface activation processing.

8. The pressure application apparatus according to claim 1, further comprising: heating/cooling means for heating/cooling a metal bump provided on the first object to be pressurized, in a state in which the metal bump is in contact with an opposing portion of the second object to be pressurized that faces the metal bump, wherein the heating/cooling means heats and melts the metal bump in the contact state of the metal bump and the opposing portion, the measurement means measures the positional shift in a first state that is a state in which the metal bump and the opposing portion are in contact with each other and the metal bump is being heated and melted, the alignment means performs positioning of the objects to be pressurized, by correcting the positional shift in the first state, and the heating/cooling means cools and solidifies the metal bump after the positioning.

9. The pressure application apparatus according to claim 8, wherein the measurement means measures the positional shift after a predetermined period has elapsed since the heating/cooling means starts heating the metal bump.

10. The pressure application apparatus according to claim 1, wherein the objects to be pressurized are in a solid-phase state, prior to contact.

11. The pressure application apparatus according to claim 1, wherein at least one of the objects to be pressurized has a resin layer on a pressure surface thereof, and the measurement means measures the positional shift between the objects to be pressurized, in a state in which the objects to be pressurized are in contact with each other at the resin layer portion.

12. The pressure application apparatus according to claim 1 further comprising: an adjustment mechanism for adjusting parallelism of the objects to be pressurized, wherein the adjustment mechanism estimates the parallelism of the objects to be pressurized immediately before contact, based on a positional shift between the objects to be pressurized that are in a non-contact state and a positional shift between the objects to be pressurized that are in a contact state, and adjusting the parallelism of the objects to be pressurized, based on a result of the estimation.

13. The pressure application apparatus according to claim 1, wherein if a result of the measurement of the positional shift by the measurement means falls within a predetermined tolerance, the alignment means performs the positioning by moving the objects to be pressurized in two translational directions parallel to the plane without involving movement in a direction of rotation around an axis that is parallel to the predetermined direction.

14. The pressure application apparatus according to claim 1, wherein the first object to be pressurized is a first object to be bonded, the second object to be pressurized is a second object to be bonded, and the pressure application apparatus bonds the objects to be pressurized including the first object to be bonded and the second object to be bonded together by applying pressure thereto.

15. The pressure application apparatus according to claim 1, wherein the first object to be pressurized is a mold, the second object to be pressurized is a substrate to which a resin layer has been applied, and the measurement means measures the positional shift between the objects to be pressurized, in a contact state in which the first object to be pressurized and the resin layer of the second object to be pressurized are in contact with each other by the relative movement operation performed by the relative movement means.

16. A pressure application method for applying pressure to objects to be pressurized including a first object to be pressurized and a second object to be pressurized, comprising the steps of:
a) moving the first object to be pressurized and the second object to be pressurized relative to each other in a predetermined direction such that the first object to be pressurized and the second object to be pressurized are brought into contact with each other;
b) measuring a positional shift between the first object to be pressurized and the second object to be pressurized in a plane perpendicular to the predetermined direction, in a state in which the objects to be pressurized are in contact with each other;
c) moving, after the measuring of step 'b', the objects to be pressurized relative to each other in the predetermined direction to temporarily release the contact state of the objects to be pressurized;
d) after said moving to release said contact state, moving the objects to be pressurized relative to each other in a plane perpendicular to the predetermined direction to correct the positional shift while the contact between the objects to be pressurized is released; and
e) after said moving of step 'd', performing a re-contact operation that brings the objects to be pressurized again into contact with each other.

17. A pressure application device for applying pressure to objects to be pressurized including a first object to be pressurized and a second object to be pressurized, comprising:
relative movement means for moving the first object to be pressurized and the second object to be pressurized relative to each other in a predetermined direction;
measurement means for measuring a positional shift between the objects to be pressurized in a plane perpendicular to the predetermined direction, in a contact state in which the first object to be pressurized and the second object to be pressurized are in contact with each other by the relative movement operation performed by the relative movement means; and
alignment means for performing positioning of the objects to be pressurized by correcting the positional shift,
wherein the measurement means acquires a captured image that includes alignment marks including a first alignment mark added to the first object to be pressurized and a second alignment mark added to the second object to be pressurized, and measures the positional shift between the objects to be pressurized on the basis of the captured image,
the captured image is acquired in a state in which the alignment marks are spaced from each other in the predetermined direction,
the measurement means includes an imaging optical system that includes focal-position adjustment means for adjusting a position where light from an object forms an image, and
the captured image is acquired in a state in which light from a virtual object forms an image on an imaging area of an image capturing unit, the virtual object being located at a position between a position of the first alignment mark and a position of the second alignment mark in the predetermined direction.

18. The pressure application device according to claim 17, wherein
the measurement means measures the positional shift between the objects to be pressurized by detecting an edge of a portion corresponding to each of the alignment marks in the captured image, using a vector correlation method.

19. The pressure application device according to claim 17, wherein
after the measurement means has measured the positional shift, the relative movement means moves the objects to be pressurized relative to each other in the predetermined direction to temporarily release the contact state of the objects to be pressurized,
the alignment means moves the objects to be pressurized relative to each other in a plane perpendicular to the predetermined direction to correct the positional shift in a state in which the contact between the objects to be pressurized has been released, and
after the alignment means has moved the objects to be pressurized relative to each other in the state in which the contact between the objects to be pressurized is released, the relative movement means performs a re-contact operation of bringing the objects to be pressurized again into contact with each other.

20. The pressure application device according to claim 19, wherein
before the objects to be pressurized are brought into contact with each other by the relative movement operation performed by the relative movement means, the measurement means measures a first positional shift in a state in which the first object to be pressurized and the second object to be pressurized face each other without contact, the first positional shift being a positional shift between the objects to be pressurized in a plane perpendicular to the predetermined direction,
the alignment means performs positioning of the objects to be pressurized by correcting the first positional shift,
after the first positional shift has been corrected, the relative movement means moves the first object to be pressurized and the second object to be pressurized relative to each other in the predetermined direction to bring the first object to be pressurized and the second object to be pressurized into contact with each other,
the measurement means measures a second positional shift in a state in which the first object to be pressurized and the second object to be pressurized are in contact with each other by the relative movement operation performed by the relative movement means after the correction of the first positional shift, the second positional shift being a positional shift between the objects to be pressurized in a plane perpendicular to the predetermined direction,
after the second positional shift has been measured, the relative movement means moves the objects to be pressurized relative to each other in the predetermined direction to temporarily release the contact state of the objects to be pressurized,
the alignment means moves the objects to be pressurized relative to each other in a plane perpendicular to the predetermined direction to eliminate the second positional shift in a state in which the contact between the objects to be pressurized has been released, and
after the contact state of the objects to be pressurized has been temporarily released and the objects to be pressurized has been moved relative to each other to eliminate the second positional shift, the relative movement means performs a re-contact operation of bringing the objects to be pressurized again into contact with each other.

21. The pressure application device according to claim 17, wherein
the alignment means performs positioning of the objects to be pressurized by correcting the positional shift while maintaining the contact state of the objects to be pressurized.

22. A pressure application method for applying pressure to objects to be pressurized including a first object to be pressurized and a second object to be pressurized, comprising the steps of:
a) moving the first object to be pressurized and the second object to be pressurized relative to each other in a predetermined direction to bring the first object to be pressurized and the second object to be pressurized into contact with each other;
b) measuring a positional shift between the objects to be pressurized in a plane perpendicular to the predetermined direction, in a contact state in which the first object to be pressurized and the second object to be pressurized are in contact with each other; and
c) performing positioning of the objects to be pressurized by correcting the positional shift,
wherein the step b) includes the steps of:
b-1) acquiring a captured image that includes alignment marks, in a state in which the alignment marks are spaced from each other in the predetermined direction, the alignment marks including a first alignment mark added to the first object to be pressurized and a second alignment mark added to the second object to be pressurized; and
b-2) measuring the positional shift between the objects to be pressurized, on the basis of the captured image, and
the captured image is acquired in a state in which focus is adjusted such that light from a virtual object forms an image on an imaging area of an image capturing unit, the virtual object being located at a position between a position of the first alignment mark and a position of the second alignment mark in the predetermined direction.

23. The pressure application method according to claim 22, wherein
in the step b-2), the positional shift between the objects to be pressurized is measured by detecting an edge of a portion corresponding to each of the alignment marks in the captured image, using a vector correlation method.

24. The pressure application method according to claim 22, wherein the step c) includes the steps of:
c-1) moving the objects to be pressurized relative to each other in the predetermined direction to temporarily release the contact state of the objects to be pressurized, the step c-1) being performed after the step b) of measuring the positional shift;
c-2 moving the objects to be ressurized relative to each other in a plane perpendicular to the predetermined direction to correct the positional shift in a state in which the contact between the objects to be pressurized has been released in the step c-1); and
c-3) performing a re-contact operation of bringing the objects to be pressurized again into contact with each other, the step c-3) being performed after the step c-2).

25. The pressure application method according to claim 24, further comprising the steps of:
d) measuring a first positional shift in a state in which the first object to be pressurized and the second object to be pressurized face each other without contact, the first positional shift being a positional shift between the objects to be pressurized in a plane perpendicular to the predetermined direction, the step d) being performed before the step a) of bringing the, objects to be pressurized into contact with each other; and e) performing positioning of the objects to be pressurized by correcting the first positional shift, wherein the step a) includes the step of:

a-1) moving the first object to be pressurized and the second object to be pressurized relative to each other in the predetermined direction to bring the first object to be pressurized and the second object to be pressurized into contact with each other, the step a-1) being performed after step e) of correcting the first positional shift, the step b) includes the step of:

b-1) measuring a second positional shift in a state in which the first object to be pressurized and the second object to be pressurized are in contact with each other by the relative movement operation performed in the step a-1), the second positional shift being a positional shift between the objects to be pressurized in a plane perpendicular to the predetermined direction, after the step b-1) of measuring the second positional shift, in the step c-1), the objects to be pressurized are moved relative to each other in the predetermined direction to temporarily release the contact state of the objects to be pressurized, and in the step c-2), the objects to be pressurized are moved relative to each other in a plane perpendicular to the predetermined direction to eliminate the second positional shift in a state in which the contact between the objects to be pressurized has been released in the step c-1).

26. The pressure application method according to claim 22, wherein in the step c), the positioning of the objects to be pressurized is performed by correcting the positional shift while maintaining the contact state of the objects to be pressurized.

27. The pressure application method according to claim 16, further comprising the steps of:

f) measuring a first positional shift in a state in which the first object to be pressurized and the second object to be pressurized face each other without contact, the first positional shift being a positional shift between the objects to be pressurized in a plane perpendicular to the predetermined direction, the step f) being performed before the step a) of bringing the objects to be pressurized into contact with each other; and g) performing positioning of the objects to be pressurized by correcting the first positional shift, wherein the step a) includes the step of a-1) moving the first object to be pressurized and the second object to be pressurized relative to each other in the predetermined direction to bring the first object to be pressurized and the second object to be pressurized into contact with each other, the step a-1) being performed after the step g) of correcting the first positional shift, the step b) includes the step of b-1) measuring a second positional shift in a state in which the first object to be pressurized and the second object to be pressurized are in contact with each other by the relative movement operation performed in the step a-1), the second positional shift being a positional shift between the objects to be pressurized in a plane perpendicular to the predetermined direction, the step c) includes the step of:

c-1) moving the objects to be pressurized relative to each other in the predetermined direction to temporarily release the contact state of the objects to be pressurized, the step c-1) being performed after the step b-1) of measuring the second positional shift, the step d) includes the step of:

d-1) moving the objects to be pressurized relative to each other in a plane perpendicular to the predetermined direction to eliminate the second positional shift in a state in which the contact between the objects to be pressurized has been released in the step c-1), and the step e) includes the step of:

e-1) performing a re-contact operation of bringing the objects to be pressurized again into contact with each other, the step e-1) being performed after the step d-1).

* * * * *